US012676195B2

(12) United States Patent (10) Patent No.: US 12,676,195 B2

Inuzuka et al. (45) Date of Patent: Jul. 7, 2026

(54) SEMICONDUCTOR MEMORY DEVICE WITH EVEN AND ODD COPLANAR WORDLINES

(71) Applicant: Kioxia Corporation, Tokyo (JP)

(72) Inventors: Yuki Inuzuka, Yokohama Kanagawa (JP); Akiyuki Murayama, Koto Tokyo (JP)

(73) Assignee: Kioxia Corporation, Tokyo (JP)

( * ) Notice: Subject to any disclaimer, the term of this patent is extended or adjusted under 35 U.S.C. 154(b) by 97 days.

(21) Appl. No.: 18/749,384

(22) Filed: Jun. 20, 2024

(65) Prior Publication Data

US 2024/0428866 A1 Dec. 26, 2024

(30) Foreign Application Priority Data

Jun. 21, 2023 (JP) ................................. 2023-101343

(51) Int. Cl.
| | |
|---|---|
| *G11C 16/26* | (2006.01) |
| *G11C 8/08* | (2006.01) |
| *G11C 8/14* | (2006.01) |
| *G11C 11/06* | (2006.01) |
| *G11C 16/04* | (2006.01) |
| *G11C 16/08* | (2006.01) |

(Continued)

(52) U.S. Cl.
CPC ................ *G11C 16/26* (2013.01); *G11C 8/08* (2013.01); *G11C 8/14* (2013.01); *G11C 11/06071* (2013.01); *G11C 16/0483* (2013.01); *G11C 16/08* (2013.01); *G11C 16/30* (2013.01); *H10B 43/10* (2023.02); *H10B 43/27* (2023.02); *G11C 2213/82* (2013.01); *G11C 2216/02* (2013.01)

(58) Field of Classification Search
CPC .. G11C 16/26; G11C 8/08; G11C 8/14; G11C 11/06071; G11C 16/0483; G11C 16/08; G11C 16/30; G11C 2213/82; G11C 2216/02; H10B 43/10; H10B 43/27
See application file for complete search history.

(56) References Cited

U.S. PATENT DOCUMENTS

| | | | | |
|---|---|---|---|---|
| 10,797,069 B2* | 10/2020 | Kondo | .............. | H01L 21/76805 |
| 11,545,190 B2* | 1/2023 | Choi | ...................... | H10B 43/27 |

(Continued)

FOREIGN PATENT DOCUMENTS

JP 2017168163 A 9/2017

*Primary Examiner* — Donald H B Braswell
(74) *Attorney, Agent, or Firm* — Kim & Stewart LLP

(57) ABSTRACT

A semiconductor memory device includes a memory pillar; first and second conductive layers on either side of the memory pillar; third and fourth conductive layers and fifth and sixth conductive layer respectively below and above first and second conductive layers; seventh and eighth conductive layers below third and fourth conductive layers; ninth and tenth conductive layers above fifth and sixth conductive layers; memory cells formed between a respective first through tenth conductive layers and the memory pillar; and a control circuit, which applies a read voltage to the first conductive layer, a negative voltage to second, fourth, and sixth conductive layers, and a read pass voltage to other conductive layers, applies the read pass voltage to first, second, fourth, and sixth conductive layers, applies a ground voltage or lower to a first group of conductive layers, and then a ground voltage to a second group of conductive layers.

20 Claims, 26 Drawing Sheets

(51) Int. Cl.
   G11C 16/30          (2006.01)
   H10B 43/10          (2023.01)
   H10B 43/27          (2023.01)

(56)                    References Cited

U.S. PATENT DOCUMENTS

| | | | |
|---|---|---|---|
| 11,812,612 B2 * | 11/2023 | Lee ........................ | H10B 63/34 |
| 2017/0271021 A1 | 9/2017 | Futatsuyama et al. | |
| 2024/0172438 A1 * | 5/2024 | Zhan ...................... | H10B 41/27 |
| 2024/0290375 A1 * | 8/2024 | Simsek-Ege ........... | G11C 5/025 |
| 2024/0397720 A1 * | 11/2024 | Or-Bach ................ | H10B 41/27 |

* cited by examiner

SEMICONDUCTOR MEMORY DEVICE WITH EVEN AND ODD COPLANAR WORDLINES

CROSS-REFERENCE TO RELATED APPLICATION(S)

This application is based upon and claims the benefit of priority from Japanese Patent Application No. 2023-101343, filed Jun. 21, 2023, the entire contents of which are incorporated herein by reference.

FIELD

Embodiments described herein relate generally to a semiconductor memory device.

BACKGROUND

A NAND flash memory is known as a type of non-volatile semiconductor memory device.

DESCRIPTION OF THE DRAWINGS

FIG. 4 is a schematic diagram showing a planar layout of a word line and the memory pillar in the semiconductor memory device according to the first embodiment.

FIG. 8 is a view of a D1-D2 cross-section of the memory cell transistor shown in FIG. 7.

FIG. 16 is a schematic diagram illustrating an electrical connection between the voltage generation circuit and the even word line driver in the semiconductor memory device according to the first embodiment.

DETAILED DESCRIPTION

Figure 1:
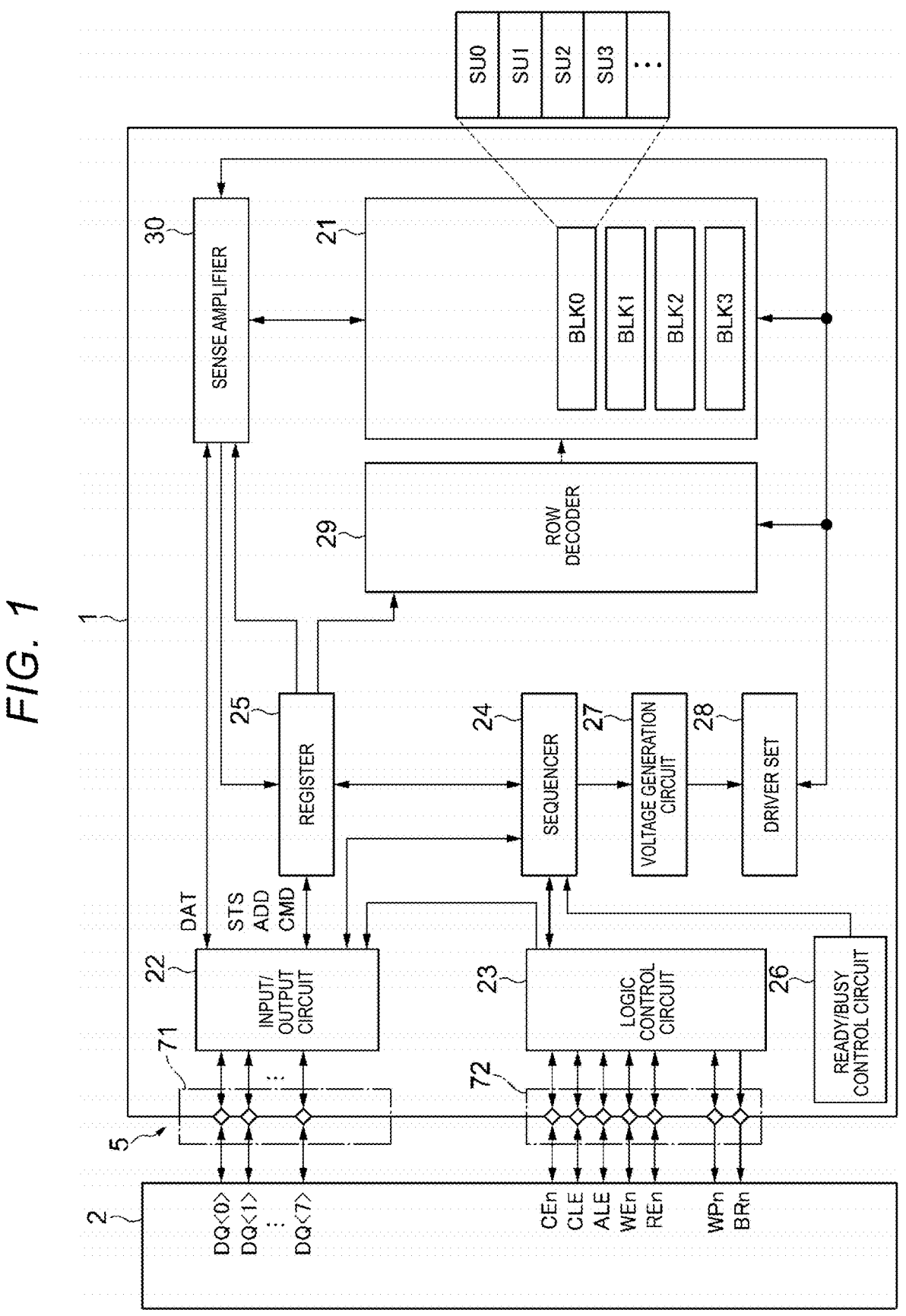
FIG. 1 is a block diagram showing a configuration of a memory system including a semiconductor memory device according to a first embodiment.

Embodiments provide a semiconductor memory device capable of reducing a variation in a threshold voltage of a memory cell transistor.

In general, according to one embodiment, a semiconductor memory device includes a substrate; a first conductive layer that is provided above the substrate, is spaced apart from the substrate in a first direction, and is parallel to a substrate surface of the substrate; a second conductive layer that is provided above the substrate, is adjacent to the first conductive layer in a second direction intersecting the first direction, and is parallel to the substrate surface; a third conductive layer that is provided between the substrate and the first conductive layer, and is parallel to the substrate surface; a fourth conductive layer that is provided between the substrate and the second conductive layer, is adjacent to the third conductive layer in the second direction, and is parallel to the substrate surface; a fifth conductive layer that is provided above the first conductive layer, and is parallel to the substrate surface; a sixth conductive layer that is provided above the second conductive layer, is adjacent to the fifth conductive layer in the second direction, and is parallel to the substrate surface; a seventh conductive layer that is provided between the substrate and the third conductive layer, and is parallel to the substrate surface; an eighth conductive layer that is provided between the substrate and the fourth conductive layer, is adjacent to the seventh conductive layer in the second direction, and is parallel to the substrate surface; a ninth conductive layer that is provided above the fifth conductive layer, and is parallel to the substrate surface; a tenth conductive layer that is provided above the sixth conductive layer, is adjacent to the ninth conductive layer in the second direction, and is parallel to the substrate surface; a memory pillar extending in the first direction between the first and second conductive layers, between the third and fourth conductive layers, between the fifth and sixth conductive layers, between the seventh and eighth conductive layers, and between the ninth and tenth conductive layers; a first memory cell that is formed between the first conductive layer and the memory pillar; a second memory cell that is formed between the second conductive layer and the memory pillar; a third memory cell that is formed between the third conductive layer and the memory pillar; a fourth memory cell that is formed between the fourth conductive layer and the memory pillar; a fifth memory cell that is formed between the fifth conductive layer and the memory pillar; a sixth memory cell that is formed between the sixth conductive layer and the memory pillar; a seventh memory cell that is formed between the seventh conductive layer and the memory pillar; an eighth memory cell that is formed between the eighth conductive layer and the memory pillar; a ninth memory cell that is formed between the ninth conductive layer and the memory pillar; a tenth memory cell that is formed between the tenth conductive layer and the memory pillar; and a control circuit that is configured to, during a read operation performed on the first memory cell, apply a first voltage to the first conductive layer, apply a second voltage lower than the first voltage to the second conductive layer, the fourth conductive layer, and the sixth conductive layer, and apply a third voltage higher than the first voltage to the third conductive layer, the fifth conductive layer, the seventh conductive layer, the eighth conductive layer, the ninth conductive layer, and the tenth conductive layer, then, apply the third voltage to the first conductive layer, the second conductive layer, the fourth conductive layer, and the sixth conductive layer, then, apply a fourth voltage lower than the first voltage to the first conductive layer, the third conductive layer, the fifth conductive layer, the seventh conductive layer, and the ninth conductive layer, and then, apply a fifth voltage lower than the first voltage to the second conductive layer, the fourth conductive layer, the sixth conductive layer, the eighth conductive layer, and the tenth conductive layer.

Hereinafter, embodiments will be described with reference to the accompanying drawings. In the drawings, the same or similar parts are denoted by the same or similar reference numerals.

First Embodiment

FIG. 1 is a block diagram showing an example of a configuration of a memory system 3 including a semiconductor memory device 1 according to the first embodiment. The configuration of the memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as a solid state drive (SSD) or an SD® card. The memory system 3 may include a host device (not shown).

The semiconductor memory device 1 is connected to, for example, the memory controller 2 and is controlled by the memory controller 2. The memory controller 2 receives, for example, a command for operating the semiconductor memory device 1 from the host device, and transmits the command to the semiconductor memory device 1. The memory controller 2 transmits the command to the semiconductor memory device 1 and controls reading of data from the semiconductor memory device 1, writing of data to the semiconductor memory device 1, or erasing of data of the semiconductor memory device 1. In the present embodiment, the semiconductor memory device 1 is, for example, a NAND flash memory.

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 30, an input/output pad group 71, and a logic control pad group 72. In the semiconductor memory device 1, various operations such as a write operation of storing write data DAT in the memory cell array 21, a read operation of reading read data DAT from the memory cell array 21, and the like are executed. The configuration of the semiconductor memory device 1 according to the present embodiment is not limited to the configuration shown in FIG. 1.

The memory cell array 21 is connected to, for example, the sense amplifier 30, the row decoder 29, and the driver set 28. The memory cell array 21 includes blocks BLK0, BLK1, . . . , and BLKn (n is an integer of 1 or more). Details will be described below, and each of the blocks BLK includes a plurality of string units SU (SU0, SU1, SU2, . . . ). Each of the string units SU includes a plurality of non-volatile memory cells associated with bit lines and word lines. The block BLK is, for example, a unit of erasing data. The data stored by a memory cell transistor MT (FIG. 2) provided in the same block BLK is erased collectively.

In the semiconductor memory device 1, for example, a triple-level cell (TLC) method or a quadruple-level cell (QLC) method may be applied. In the TLC method, 3 bits of data are stored in each memory cell, and in the QLC method, 4 bits of data are stored in each memory cell. It should be noted that 2 bits or less of data may be stored in each memory cell, or 5 bits or more of data may be stored in each memory cell.

The input/output circuit 22 is connected to, for example, the register 25, the logic control circuit 23, and the sense amplifier 30. The input/output circuit 22 controls communication of a data signal DQ<7:0> between the memory controller 2 and the semiconductor memory device 1.

The data signal DQ<7:0> is an 8-bit signal. The data signal DQ<7:0> contains data communicated between the semiconductor memory device 1 and the memory controller 2, and includes a command CMD, data DAT, address information ADD, status information STS, and the like. The command CMD includes, for example, a command for executing the command transmitted from the memory controller 2 to the semiconductor memory device 1. The data DAT includes the write data DAT to the semiconductor memory device 1 or the read data DAT from the semiconductor memory device 1. The address information ADD includes, for example, a column address and a row address for selecting a plurality of non-volatile memory cells associated with the bit lines and the word lines. The status information STS includes, for example, information about status of the semiconductor memory device 1 with respect to the write operation and the read operation.

More specifically, the input/output circuit 22 includes an input circuit and an output circuit, and the input circuit and the output circuit perform the following processing. The input circuit receives the write data DAT, the address information ADD, and the command CMD from the memory controller 2. The input circuit transmits the received write data DAT to a sense amplifier 70, and transmits the received address information ADD and command CMD to the register 25. Meanwhile, the output circuit receives the status information STS from the register 25 and receives the read data DAT from the sense amplifier 70. The output circuit transmits the received status information STS and the read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signal.

The chip enable signal CEn is a signal for enabling the semiconductor memory device 1. The command latch enable signal CLE is a signal for notifying the input/output circuit 22 that the signal DQ to be input to the semiconductor memory device 1 contains the command CMD. The address latch enable signal ALE is a signal for notifying the input/output circuit 22 that the signal DQ to be input to the semiconductor memory device 1 contains the address information ADD. The write enable signal WEn and the read enable signal REn are signals for, for example, commanding the input and the output of the data signal DQ to the input/output circuit 22, respectively. The write protection signal WPn is a signal for instructing the semiconductor memory device 1 to prohibit writing and erasing of data.

The sequencer 24 is connected to, for example, the ready/busy control circuit 26, the sense amplifier 30, and the driver set 28. The sequencer 24 controls the operation of the entire semiconductor memory device 1 based on the command CMD stored in a command register. For example, the sequencer 24 controls the sense amplifier 30, the row decoder 29, the voltage generation circuit 27, the driver set 28, and the like to execute various operations such as the write operation and the read operation.

The register 25 includes, for example, a status register (not shown), an address register (not shown), the command register (not shown), and the like. The status register receives the status information STS from the sequencer 24 and stores the status information STS, and transmits the status information STS to the input/output circuit 22 based on an instruction from the sequencer 24. The address register receives the address information ADD from the input/output circuit 22 and stores the address information ADD. The address register transmits the column address in the address information ADD to the sense amplifier 70 and transmits the row address in the address information ADD to the row decoder 29. The command register receives the command CMD from the input/output circuit 22, stores the command CMD, and transmits the command CMD to the sequencer 24.

The ready/busy control circuit 26 generates a ready/busy signal R/Bn in accordance with the control by the sequencer 24, and transmits the generated ready/busy signal R/Bn to the memory controller 2. The ready/busy signal R/Bn is a signal for notifying whether the semiconductor memory device 1 is in a ready state capable of receiving a command from the memory controller 2 or in a busy state not capable of receiving the command.

The voltage generation circuit 27 is connected to, for example, the driver set 28. The voltage generation circuit 27 generates a voltage used in the write operation, the read operation, and the like based on the control by the sequencer 24, and supplies the generated voltage to the driver set 28.

Figure 12:
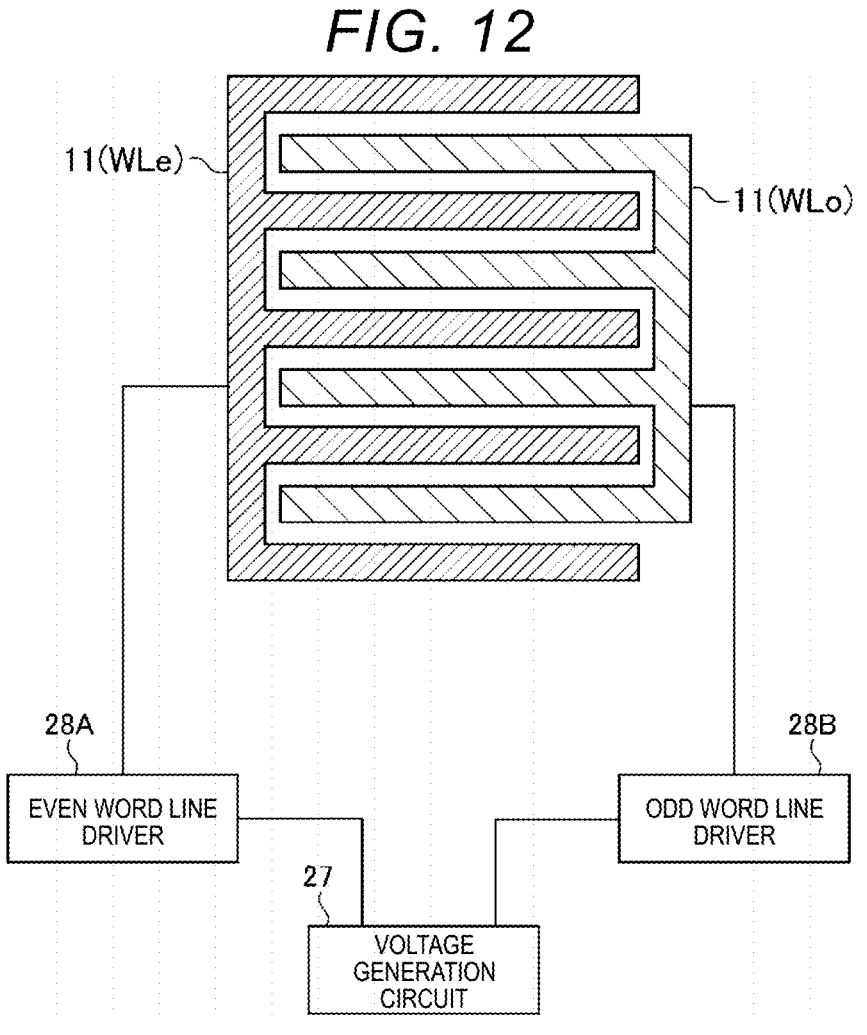
FIG. 12 is a diagram illustrating an electrical connection of a voltage generation circuit, a driver set, the select gate line, or the word line in the semiconductor memory device according to the first embodiment.

The driver set 28 includes, for example, an even word line driver 28A (FIG. 12) and an odd word line driver 28B (FIG. 12). The driver set 28 is connected to the memory cell array 21, the sense amplifier 70, and the row decoder 29. The driver set 28 generates various voltages to be applied to a select gate line SGD (FIG. 2), a word line WL (FIG. 2), a source line SL (FIG. 2), and the like in various operations such as the read operation and the write operation based on the voltage supplied from the voltage generation circuit 27. The driver set 28 supplies the generated voltage to the even word line driver 28A, the odd word line driver 28B, the sense amplifier 30, the row decoder 29, the source line SL, and the like.

The row decoder 29 receives the row address from the address register and decodes the received row address. The row decoder 29 selects a target block BLK for executing various operations such as the read operation and the write operation based on a result of the decoding. The row decoder 29 can supply the voltage supplied from the driver set 28 to the selected block BLK.

The sense amplifier 30 receives, for example, the column address from the address register, and decodes the received column address. In addition, the sense amplifier 30 executes a transfer operation of the data DAT between the memory controller 2 and the memory cell array 21 based on a result of the decoding. The sense amplifier 30 includes, for example, a sense amplifier unit (not shown) provided for each bit line. The sense amplifier 30 enables a voltage to be supplied to the bit line BL by using the sense amplifier unit. For example, the sense amplifier 30 can supply a voltage to the bit line by using the sense amplifier unit. In addition, the sense amplifier 30 senses the data read from the memory cell array 21 to generate the read data DAT, and transmits the generated read data DAT to the memory controller 2 via the input/output circuit 22. In addition, the sense amplifier 30 receives the write data DAT from the memory controller 2 via the input/output circuit 22, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy control circuit 26 to the memory controller 2.

Figure 2:
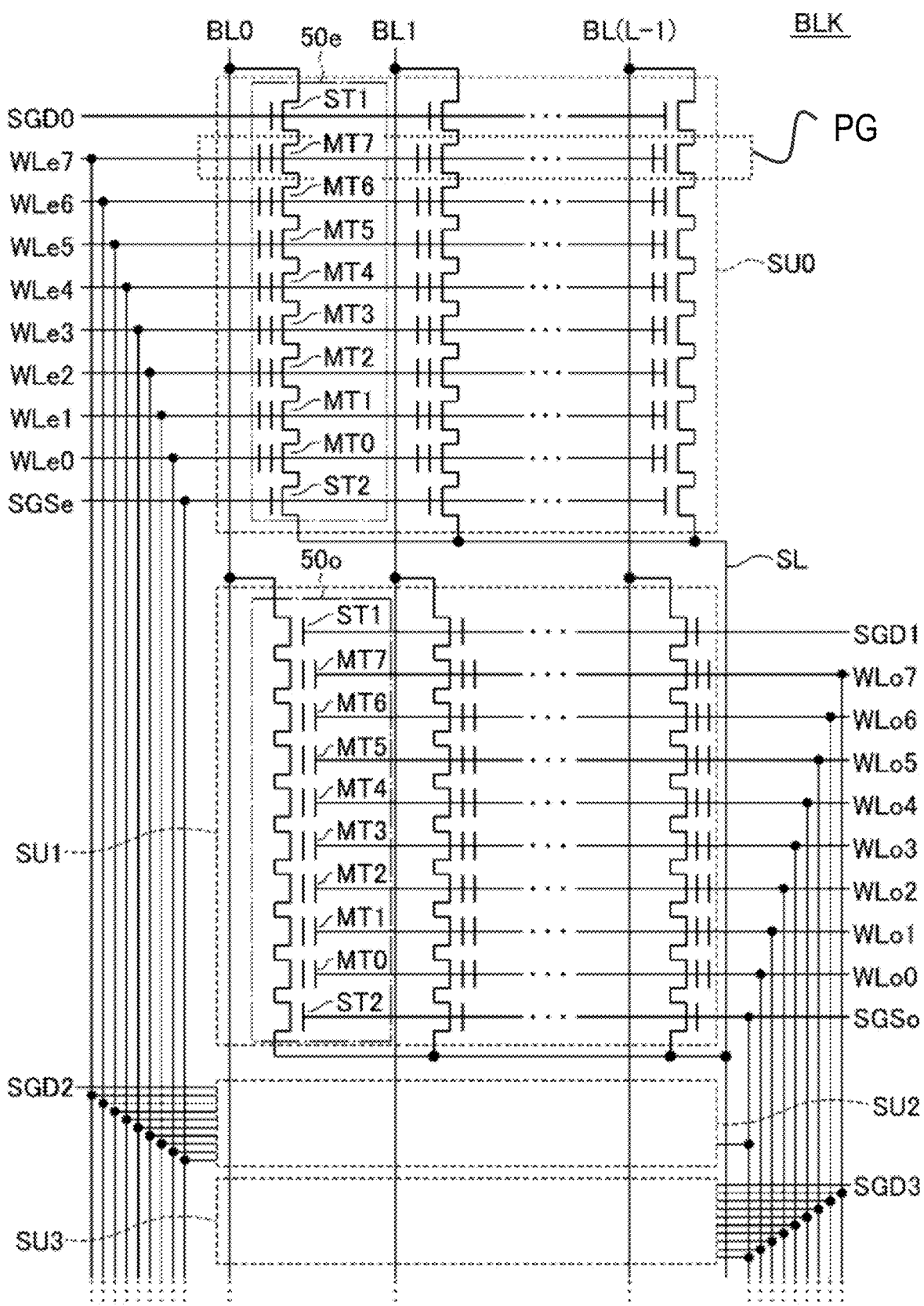
FIG. 2 is a schematic diagram showing a circuit configuration of a memory cell array in the semiconductor memory device according to the first embodiment.

FIG. 2 is an example of a circuit configuration of the memory cell array 21 shown in FIG. 1. FIG. 2 is a diagram showing a circuit configuration of one block BLK of a plurality of blocks BLK provided in the memory cell array 21. For example, each of the plurality of blocks BLK provided in the memory cell array 21 has the circuit configuration shown in FIG. 2. The configuration of the memory cell array 21 according to the present embodiment is not limited to the configuration shown in FIG. 2. In the description of FIG. 2, the description of the configuration that is the same as or similar to the configuration of FIG. 1 may be omitted.

As shown in FIG. 2, the block BLK includes the plurality of string units SU (SU0, SU1, SU2, SU3). In the present embodiment, the write operation and the read operation are executed in units of the memory cell transistors MT referred to as pages PG. Each unit (each page PG) corresponds to one of the word lines WLe0 to WLe7 and WLo0 to WLo7 and to one of the select gate lines SGD0 to SGD3. Each of the string units SU includes a plurality of NAND strings 50. For example, the string units SU0 and SU2 include a plurality of NAND strings 50c, and the string units SU1 and SU3 include a plurality of NAND strings 500. It should be noted that, in FIG. 2, the example is shown in which each block BLK includes four string units SU0, SU1, SU2, and SU3, but the number of string units provided in each block is not limited to four. For example, each block BLK may include six or eight string units.

Each of the NAND strings 50 includes, for example, eight memory cell transistors MT (MT0 to MT7) and select transistors ST1 and ST2. The memory cell transistor MT includes a control gate and a charge storage layer, and stores data in a non-volatile manner. The memory cell transistor MT is connected in series between a source of the select transistor ST1 and a drain of the select transistor ST2.

A gate of the select transistor ST1 in each of the string units SU is connected to the select gate line SGD (SGD0, SGD1, . . . ), respectively. The select gate line SGD is independently controlled by the row decoder 29. In addition, a gate of the select transistor ST2 in each of the even-numbered string units SUe (SU0, SU2, . . . ) is connected to, for example, the even select gate line SGSe, and the gate of the select transistor ST2 in each of the odd-numbered string units SUo (SU1, SU3, . . . ) is connected to, for example, the odd select gate line SGSo. The even select gate line SGSe and the odd select gate line SGSo may be, for example, connected to each other and controlled together, or may be independently provided and independently controlled.

The control gates of the memory cell transistors MT (MT0 to MT7) provided in the string unit SUe in the same block BLK are commonly connected to word lines WLe (WLe0 to WLe7), respectively. The control gates of the memory cell transistors MT (MT0 to MT7) provided in the string unit SUo in the same block BLK are commonly connected to word lines WLo (WLo0 to WLo7), respectively. The select gate line WLe and the select gate line WLo are independently controlled by the row decoder 29.

The drains of the select transistors ST1 of the NAND strings 50 in the same column in the memory cell array 21 are commonly connected to the bit lines BL (BL0 to BL(L−1), where (L−1) is a natural number of 2 or more). That is, the bit line BL is commonly connected to the NAND string 50 across the plurality of string units SU. The sources of a plurality of select transistors ST2 are commonly connected to the source line SL. The source line SL is, for example, electrically connected to the driver set 28, and is supplied with the voltage from the voltage generation circuit 27 or the driver set 28 by the control of the voltage generation circuit 27 and the driver set 28 using the sequencer 24. In addition, the semiconductor memory device 1 according to one embodiment may include a plurality of source lines SL. For example, each of the plurality of source lines SL may be electrically connected to the driver set 28, and each of the plurality of source lines SL may be supplied with a different voltage from the voltage generation circuit 27 or the driver set 28 by the control of the voltage generation circuit 27 and the driver set 28 using the sequencer 24.

The string unit SU includes a plurality of NAND strings 50 that are connected to different bit lines BL and are connected to the same select gate line SGD. The block BLK includes a plurality of string units SU sharing the word line WL. The memory cell array 21 includes a plurality of blocks BLK sharing the bit lines BL. In the memory cell array 21, the select gate lines SGS and the word lines WL, and the select gate lines SGD described above are stacked above a source line layer, and the memory cell transistors MT are arranged in three dimensions.

Figure 3:
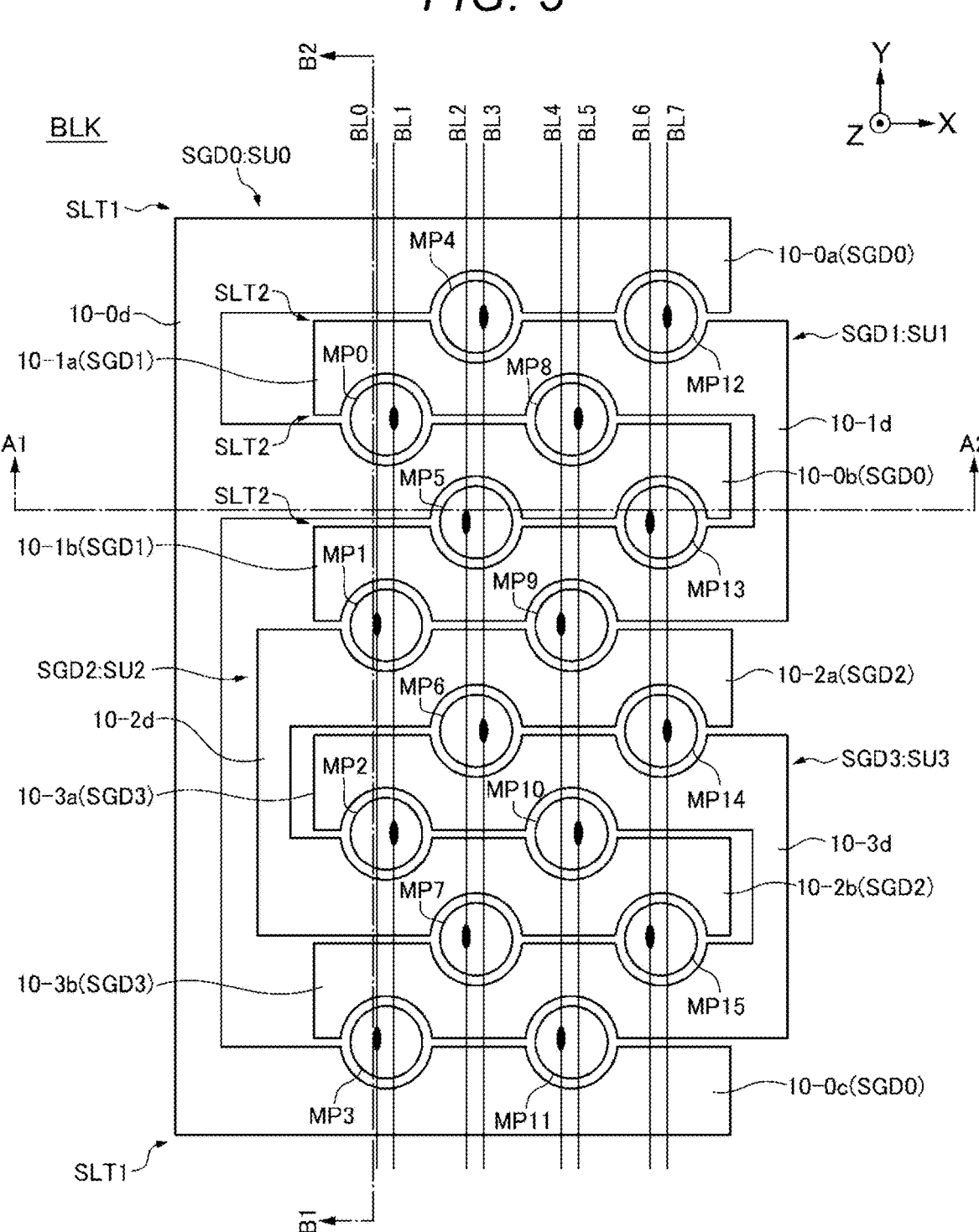
FIG. 3 is a schematic diagram showing a planar layout of a select gate line, a bit line, and a memory pillar in the semiconductor memory device according to the first embodiment.

FIG. 3 is a diagram showing a planar layout of the select gate line SGD in a plane (XY plane) parallel to the source line layer of a certain block BLK. As shown in FIG. 3, in the semiconductor memory device 1 according to the present embodiment, for example, four select gate lines SGD are provided in one block BLK. The planar layout of the select gate line SGD according to one embodiment is not limited to the layout shown in FIG. 3. In the description of FIG. 3, the description of the configuration that is the same as or similar to the configuration of FIGS. 1 and 2 may be omitted.

As shown in FIG. 3, in the semiconductor memory device 1 according to the present embodiment, for example, three wiring layers 10-0a, 10-0b, and 10-0c extending in an X direction are connected to each other by using a first connection portion 10-0d extending in a Y direction. The wiring layers 10-0a and 10-0c are located at both ends in the Y direction. The wiring layer 10-0a and the wiring layer 10-0b are adjacent to each other in the Y direction with another wiring layer (wiring layer 10-1a) interposed therebetween. The first connection portion 10-0d is located at one end in the X direction. The three wiring layers 10-0a, 10-0b, and 10-0c function as the select gate line SGD0. In the present embodiment, for example, the Y direction is a direction orthogonal to or substantially orthogonal to the X direction.

Wiring layers 10-1a and 10-1b extending in the X direction are connected to each other by using a second connection portion 10-1d extending in the Y direction. The wiring layer 10-1a is located between the wiring layers 10-0a and 10-0b. The wiring layer 10-1b is located between the wiring layer 10-0b and another wiring layer (wiring layer 10-2a). The second connection portion 10-1d is located at the other end on a side opposite to the first connection portion 10-0d in the X direction. The two wiring layers 10-1a and 10-1b function as the select gate line SGD1.

Wiring layers 10-2a and 10-2b extending in the X direction are connected to each other by a first connection portion 10-2d extending in the Y direction. Similarly, wiring layers 10-3a and 10-3b extending in the X direction are connected to each other by a second connection portion 10-3d extending in the Y direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connection portion 10-2d is located at one end on the same side as the first connection portion 10-0d in the X direction. The second connection portion 10-3d is located at the other end on the side opposite to the first connection portion 10-0d in the X direction. The two wiring layers 10-2a and 10-2b function as the select gate line SGD2. The two wiring layers 10-3a and 10-3b function as the select gate line SGD3.

The present embodiment is described with reference to a configuration in which the wiring layers are connected by using the first connection portions 10-0*d* and 10-2*d* or the second connection portions 10-1*d* and 10-3*d*, but the present embodiment is not limited to this configuration. For example, each of the wiring layers may be independent and control performed such that the same voltage is supplied to the wiring layers 10-0*a*, 10-0*b*, and 10-0*c*, the same voltage is supplied to the wiring layers 10-1*a* and 10-1*b*, the same voltage is supplied to the wiring layers 10-2*a* and 10-2*b*, and the same voltage is supplied to the wiring layers 10-3*a* and 10-3*b*.

The string unit SU including the NAND string 50*c* of the memory pillar MP adjacent to the wiring layers 10-0*a*, 10-0*b*, and 10-0*c* is referred to as SU0. The string unit SU including the NAND string 500 of the memory pillar MP adjacent to the wiring layers 10-1*a* and 10-1*b* is referred to as SU1. The string unit SU including the NAND string 50*e* of the memory pillar MP adjacent to the wiring layers 10-2*a* and 10-2*b* is referred to as SU2. The string unit SU including the NAND string 500 of the memory pillar MP adjacent to the wiring layers 10-3*a* and 10-3*b* is referred to as SU3.

The adjacent wiring layers 10 in the Y direction in the block BLK are insulated from each other. A region where the adjacent wiring layers 10 are insulated from each other is referred to as a slit SLT2. In the slit SLT2, for example, a region from the plane parallel to the source line layer to at least the layer in which the wiring layer 10 is provided is embedded with an insulating film (not shown) therebetween. In addition, a plurality of blocks BLK shown in FIG. 3 are disposed in the memory cell array 21 in the Y direction. Similarly to the adjacent wiring layer 10 in the Y direction in the block BLK, a space between the adjacent blocks BLK in the Y direction is embedded with an insulating film (not shown), and the adjacent blocks BLK in the Y direction are also insulated from each other. A region in which the adjacent blocks BLK are insulated from each other is referred to as a slit SLT1. Similarly to the slit SLT2, in the slit SLT1, the insulating film is embedded in a region from the plane parallel to the source line layer to at least the layer in which the wiring layer 10 is provided.

A plurality of memory pillars MP (MP0 to MP15) are provided between the adjacent wiring layers 10 in the Y direction. The plurality of memory pillars MP are provided in a memory cell portion. Each of the plurality of memory pillars MP is provided along the Z direction. In one embodiment, for example, the Z direction is a direction orthogonal or substantially orthogonal to the XY direction, and is a direction perpendicular or substantially perpendicular to the plane parallel to the source line layer.

Specifically, the memory pillars MP4 and MP12 are provided between the wiring layers 10-0*a* and 10-1*a*. The memory pillars MP0 and MP8 are provided between the wiring layers 10-1*a* and 10-0*b*. The memory pillars MP5 and MP13 are provided between the wiring layers 10-0*b* and 10-1*b*. The memory pillars MP1 and MP9 are provided between the wiring layers 10-1*b* and 10-2*a*. The memory pillars MP6 and MP14 are provided between the wiring layers 10-2*a* and 10-3*a*. The memory pillars MP2 and MP10 are provided between the wiring layers 10-3*a* and 10-2*b*. The memory pillars MP7 and MP15 are provided between the wiring layers 10-2*b* and 10-3*b*. The memory pillars MP3 and MP11 are provided between the wiring layers 10-3*b* and 10-0*c*.

The memory pillar MP is a structural body that forms the select transistors ST1 and ST2 and the memory cell transistor MT. A detailed structure of the memory pillar MP will be described below.

The memory pillars MP0 to MP3 are aligned along the Y direction. The memory pillars MP8 to MP11 are aligned along the Y direction at positions adjacent to the memory pillars MP0 to MP3 in the X direction. That is, the memory pillars MP0 to MP3 and the memory pillars MP8 to MP11 are arranged in parallel in both the X and Y directions.

The memory pillars MP4 to MP7 and the memory pillars MP12 to MP15 are aligned along the Y direction. The memory pillars MP4 to MP7 are located between the memory pillars MP0 to MP3 and the memory pillars MP8 to MP11 in the X direction. The memory pillars MP12 to MP15 are located such that the memory pillars MP8 to MP11 are interposed between the memory pillars MP12 to MP15 and the memory pillars MP4 to MP7 in the X direction. That is, the memory pillars MP4 to MP7 and the memory pillars MP12 to MP15 are arranged in parallel in both the X and Y directions.

Two bit lines BL0 and BL1 are provided above the memory pillars MP0 to MP3. The bit line BL0 is commonly connected to the memory pillars MP1 and MP3. The bit line BL1 is commonly connected to the memory pillars MP0 and MP2. Two bit lines BL2 and BL3 are provided above the memory pillars MP4 to MP7. The bit line BL2 is commonly connected to the memory pillars MP5 and MP7. The bit line BL3 is commonly connected to the memory pillars MP4 and MP6.

Two bit lines BL4 and BL5 are provided above the memory pillars MP8 to MP11. The bit line BL4 is commonly connected to the memory pillars MP9 and MP11. The bit line BL5 is commonly connected to the memory pillars MP8 and MP10. Two bit lines BL6 and BL7 are provided above the memory pillars MP12 to MP15. The bit line BL6 is commonly connected to the memory pillars MP13 and MP15. The bit line BL7 is commonly connected to the memory pillars MP12 and MP14.

As described above, the memory pillar MP is provided at a position spanning two wiring layers 10 in the Y direction, and is embedded in a part of any slit SLT2 of a plurality of slits SL2. In addition, one slit SLT2 is provided between adjacent memory pillars MP in the Y direction.

No memory pillar MP is provided between the adjacent wiring layers 10-0*a* and 10-0b with the slit SLT1 interposed therebetween.

Figure 4:
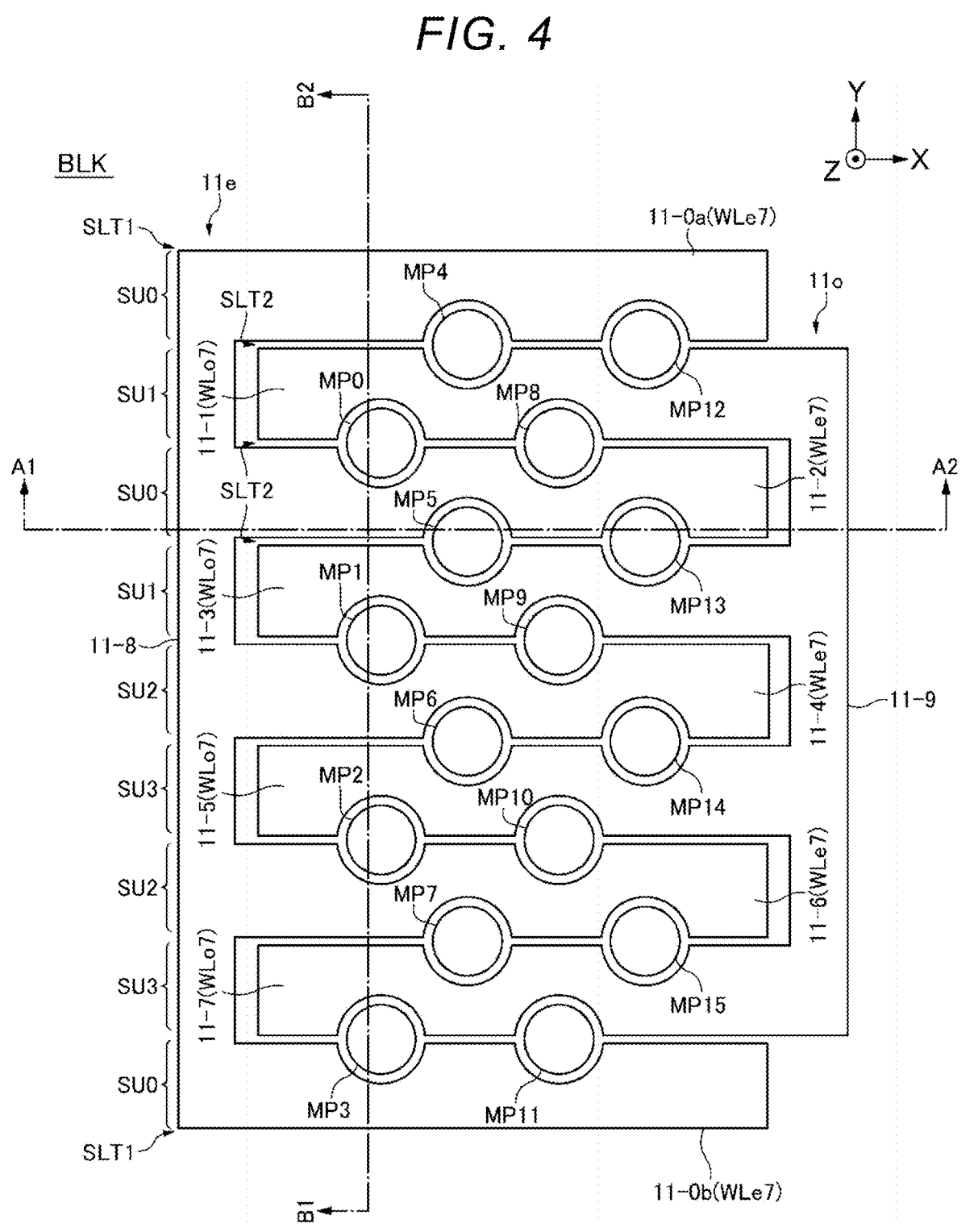

FIG. 4 is a diagram showing a planar layout of the word line WL on the XY plane. The layout shown in FIG. 4 corresponds to the layout of the region for one block of FIG. 3, and is a layout of a wiring layer 11 provided in a lower layer than the wiring layer 10 shown in FIG. 3. The planar layout of the word line WL according to one embodiment is not limited to the layout shown in FIG. 4. In the description of FIG. 4, the description of the configuration that is the same as or similar to the configuration of FIGS. 1 to 3 may be omitted.

As shown in FIG. 4, nine wiring layers 11 (wiring layers 11-0 to 11-7, where the wiring layer 11-0 includes a wiring layer 11-0*a* and a wiring layer 11-0*b*) extending in the X direction are disposed along the Y direction. The wiring layers 11-0 to 11-7 are disposed below the wiring layers 10 in the Z direction, respectively. An insulating film is provided between the wiring layers 11-0 to 11-7 and the wiring layers 10, and the wiring layers 11-0 to 11-7 and the wiring layers 10 are insulated from each other.

Each wiring layer 11 functions as a word line WL7. The other word lines WL0 to WL6 also have the same configuration as the word line WL7. In the example shown in FIG. 4, the wiring layers 11-0a, 11-2, 11-4, 11-6, and 11-Ob function as the word line WLe7. The wiring layers 11-0a, 11-2, 11-4, 11-6, and 11-Ob are connected to each other by a first connection portion 11-8 extending in the Y direction. The first connection portion 11-8 is provided at one end in the X direction. Through the first connection portion 11-8, the wiring layers 11-0a, 11-2, 11-4, 11-6, and 11-Ob are connected to the row decoder 29. The first connection portion 11-8 and the wiring layers 11-0a, 11-2, 11-4, 11-6, and 11-Ob may be collectively referred to as a wiring layer 11e.

In addition, the wiring layers 11-1, 11-3, 11-5, and 11-7 function as a word line WLo7. The wiring layers 11-1, 11-3, 11-5, and 11-7 are connected to each other by a second connection portion 11-9 extending in the Y direction. The second connection portion 11-9 is provided at the other end on a side opposite to the first connection portion 11-8 in the X direction. Through the second connection portion 11-9, the wiring layers 11-1, 11-3, 11-5, and 11-7 are connected to the row decoder 29. The second connection portion 11-9 and the wiring layers 11-1, 11-3, 11-5, and 11-7 may be collectively referred to as a wiring layer 110.

The memory cell portion is provided between the first connection portion 11-8 and the second connection portion 11-9. In the memory cell portion, the adjacent wiring layers 11 in the Y direction are separated from each other by the slit SLT2 shown in FIG. 3. In addition, the wiring layers 11 between the adjacent blocks BLK in the Y direction are separated from each other by the slit SLT1 in the same manner as by the slit SLT2. The memory cell portion includes the memory pillars MP0 to MP15 that are depicted in FIG. 3.

The select gate line SGS and the word lines WL0 to WL6 have the same configuration as the word line WL7 shown in FIG. 4.

Figure 5:
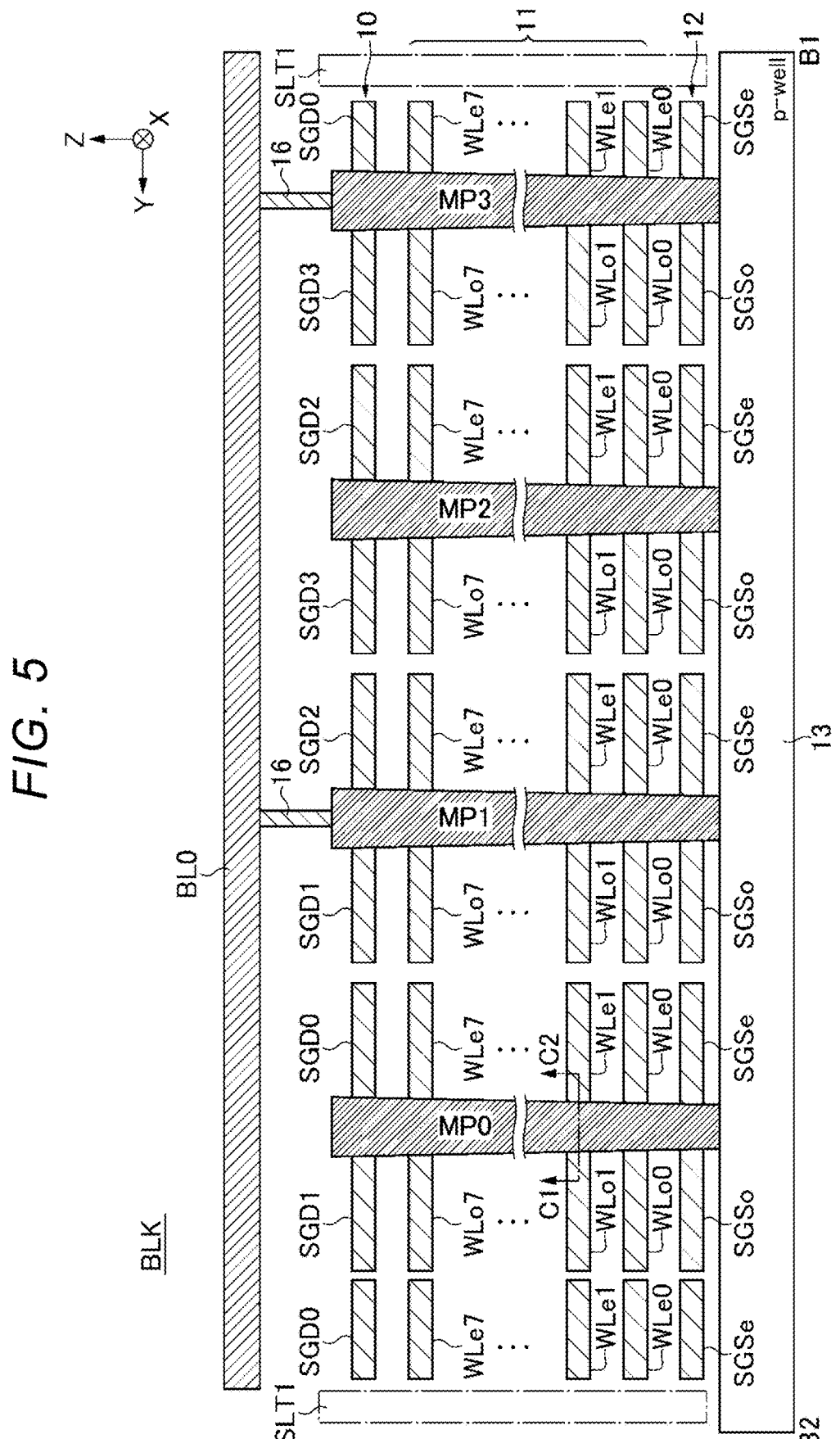
FIG. 5 is a view of a B1-B2 cross-section of the semiconductor memory device shown in FIGS. 3 and 4.

FIG. 5 is a view showing a B1-B2 cross-section of the semiconductor memory device shown in FIG. 4. In the description of FIG. 5, the description of the configuration that is the same as or similar to the configuration of FIGS. 1 to 4 may be omitted.

As shown in FIG. 5, a wiring layer 12 is provided above a source line layer 13 in the Z direction. The source line layer 13 functions as the source line SL. The wiring layer 12 may be provided above a p-type well region in a semiconductor substrate instead of the source line layer 13 shown in FIG. 5. In this case, the source line SL is electrically connected to the p-type well region in the semiconductor substrate. The wiring layer 12 functions as the select gate line SGS. Eight wiring layers 11 are stacked on the wiring layer 12 in the Z direction. Each wiring layer 11 functions as the word line WL. In particular, the eight wiring layers 11 respectively correspond to the word lines WL0 to WL7. FIG. 4 is a diagram showing a planar layout of the wiring layer 11 functioning as the word line WL, and FIG. 3 is a diagram showing a planar layout of the wiring layer 10 functioning as the select gate line SGD. A planar layout of the wiring layer 12 functioning as the select gate line SGS is, for example, a layout in which the wiring layer 11 functioning as the word line WL shown in FIG. 4 is replaced with the wiring layer 12 functioning as the select gate line SGS.

The wiring layer 12 functions as the even select gate line SGSe or the odd select gate line SGSo. The even select gate line SGSe and the odd select gate line SGSo are alternately arranged in the Y direction via the slit SLT2. A memory pillar MP is provided between the even select gate line SGSe and the odd select gate line SGSo adjacent to each other in the Y direction.

The wiring layer 11 functions as an even word line WLe or an odd word line WLo. The even word line WLe and the odd word line WLo are alternately arranged in the Y direction via the slit SLT2. A memory pillar MP is provided between the word lines WLe and WLo adjacent to each other in the Y direction. A memory cell described later is provided between the memory pillar MP and the word line WLe and between the memory pillar MP and the word line WLo.

The slit SLT1 is provided between the adjacent blocks BLK in the Y direction. As described above, the slit SLT1 is provided with an insulating layer. A contact plug or a groove-shaped structural body formed of a conductor may be provided in the slit SLT1 with an insulator on either side thereof in the Y direction. When the contact plug or the groove-shaped structural body formed of the conductor is provided in the slit SLT1, a voltage can be applied to the source line layer 13. A width of the slit SLT1 along the Y direction is larger than a width of the slit SLT2 along the Y direction.

As shown in FIGS. 3 and 5, the memory pillar MP is electrically connected to the bit line BL. For example, the memory pillar MP0 and the bit line BL1 are connected to each other via a contact plug 16. In addition, the memory pillar MP1 and the bit line BL0 are connected to each other via the contact plug 16, the memory pillar MP2 and the bit line BL1 are connected to each other via the contact plug 16, and the memory pillar MP3 and the bit line BL0 are connected to each other via the contact plug 16. Similarly, each of the memory pillars MP4 to MP7 is connected to the bit line BL2 or BL3 via the contact plug 16, the memory pillars MP8 to MP11 are connected to the bit lines BL4 or BL5 via the contact plug 16, and the memory pillars MP12 to MP15 are connected to the bit lines BL6 or BL7 via the contact plug 16.

Figure 6:
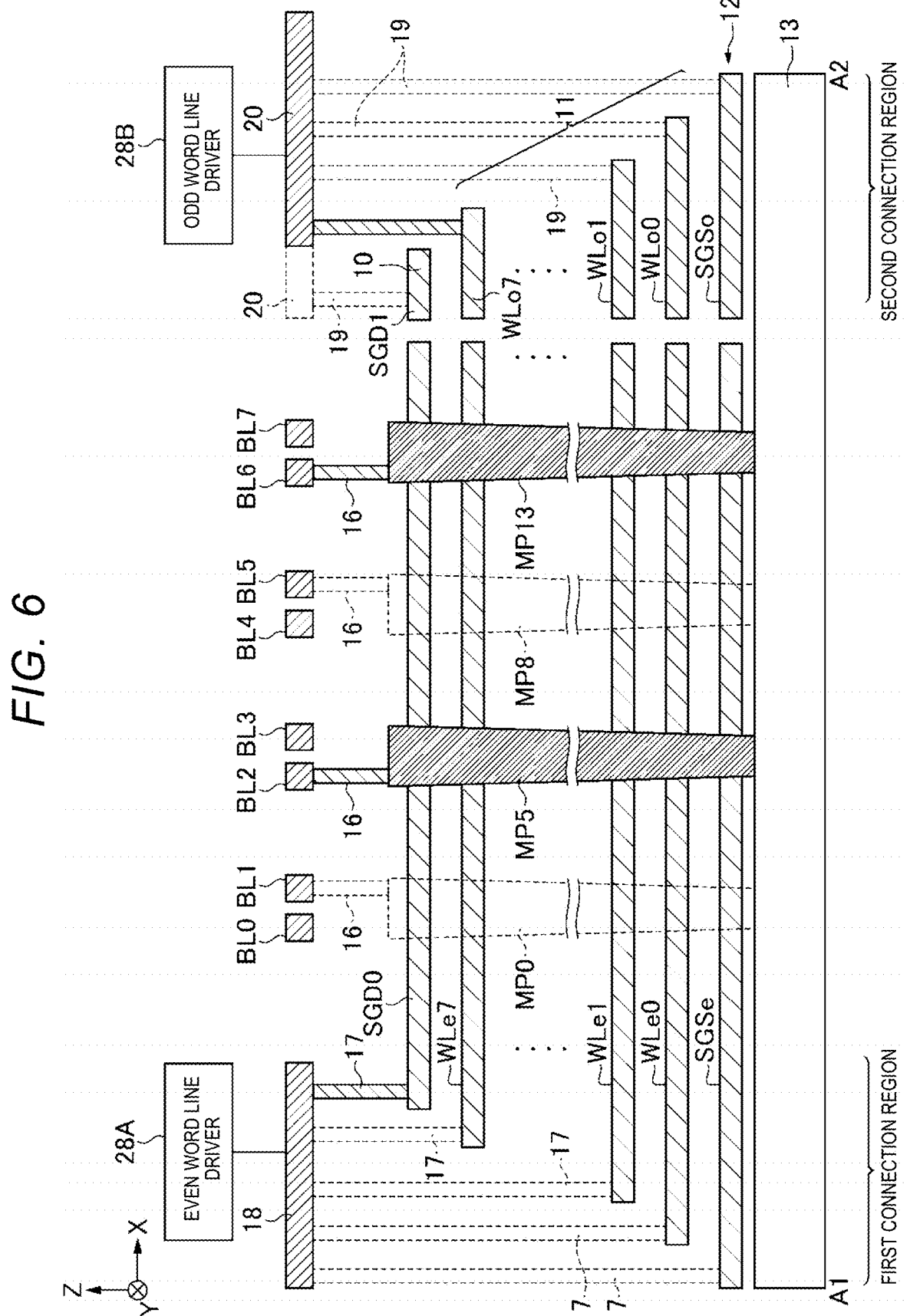
FIG. 6 is a view of an A1-A2 cross-section of the semiconductor memory device shown in FIGS. 3 and 4.

FIG. 6 is a view showing an A1-A2 cross-section of the semiconductor memory device shown in FIG. 3. In the description of FIG. 6, the description of the configuration that is the same as or similar to the configuration of FIGS. 1 to 5 may be omitted. Since a stacked structure of the source line layer 13, the wiring layer 12, the wiring layer 11, and the wiring layer 10, and the configuration of the memory cell portion are as described with reference to FIG. 5, the description thereof will be omitted here. In FIG. 6, a configuration present in a depth direction of the A1-A2 cross-section is shown by a dotted line.

As shown in FIG. 6, in a first connection region, the wiring layer 10, the wiring layer 11, and the wiring layer 12 are provided, for example, in a stepped shape. That is, when viewed in the XY plane, an upper surface of an end part of each of the wiring layer 10, the eight wiring layers 11, and the wiring layer 12 is exposed in the first connection region. A contact plug 17 is provided on the upper surface of the end part of each of the wiring layer 10, the eight wiring layers 11, and the wiring layer 12, which are exposed in the first connection region. The contact plug 17 is connected to a metal wiring layer 18. For example, using the metal wiring layer 18, the wiring layer 10 functioning as the even-numbered select gate lines SGD0 and SGD2, the wiring layers 11 functioning as the even word lines WLe, and the wiring layer 12 functioning as the even select gate lines SGSe are electrically connected to the even word line driver 28A via the row decoder 29 (FIG. 1).

Similarly to the first connection region, in a second connection region, the wiring layer 10, the wiring layers 11, and the wiring layer 12 are provided, for example, in a stepped shape When viewed in the XY plane, the upper surface of the end part of each of the wiring layer 10, the eight wiring layers 11, and the wiring layer 12 is exposed in the second connection region. A contact plug 19 is provided on the upper surface of the end part of the wiring layer 10 and on the upper surface of the end part of each of the eight wiring layers 11 and the wiring layer 12, which are exposed in the second connection region, and the contact plug 19 is connected to a metal wiring layer 20. For example, using the metal wiring layer 20, the odd-numbered select gate lines SGD1 and SGD3, the wiring layers 11 functioning as the odd word lines WLo, and the wiring layer 12 functioning as the odd select gate line SGSo are electrically connected to the odd word line driver 28B via the row decoder 29 (FIG. 1).

The wiring layer 10 may be electrically connected to the row decoder 29 or the even word line driver 28A and the odd word line driver 28B via the second connection region instead of the first connection region, or may be electrically connected to the row decoder 29 or the even word line driver 28A and the odd word line driver 28B via both the first connection region and the second connection region.

Figure 7:
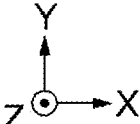
FIG. 7 is a view of a C1-C2 cross-section of a memory cell transistor shown in FIG. 5.
Figure 8:
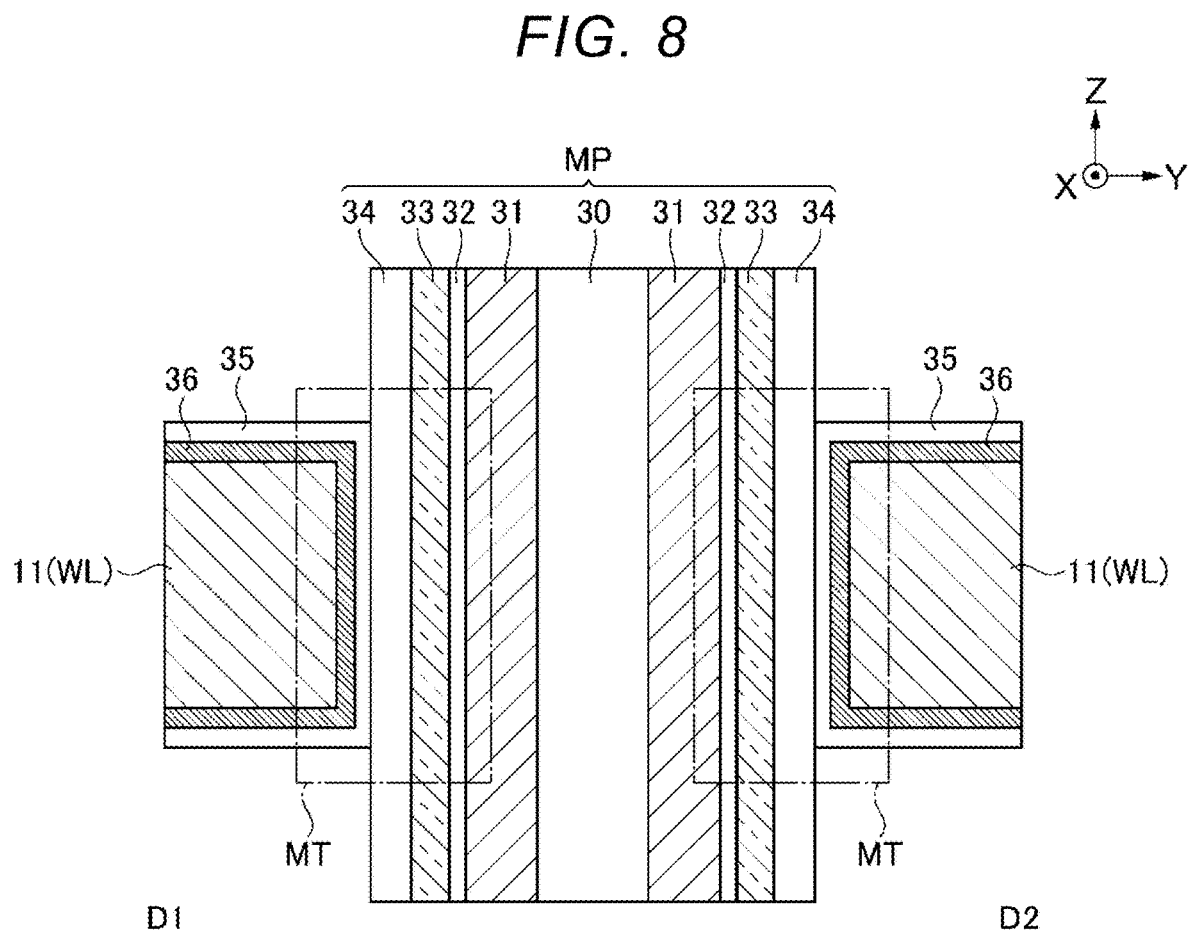

FIG. 7 is a view showing a C1-C2 cross-section of the memory cell transistor according to the present embodiment, and FIG. 8 is a diagram showing a D1-D2 cross-section of the memory cell transistor shown in FIG. 7. FIGS. 7 and 8 are cross-sectional views showing a region including two memory cell transistors MT. In a first example, the charge storage layer provided in the memory cell transistor MT is an insulating film. In the description of FIGS. 7 and 8, the description of the configuration that is the same as or similar to the configuration of FIGS. 1 to 6 may be omitted.

As shown in FIGS. 7 and 8, the memory pillar MP includes an insulating layer 30, a semiconductor layer 31, and insulating layers 32 to 34, all of which extend in the Z direction. The insulating layer 30 is formed of, for example, a silicon oxide film. The semiconductor layer 31 surrounds the periphery of the insulating layer 30 and functions as a region where a channel of the memory cell transistor MT is formed. The semiconductor layer 31 is formed of, for example, a polycrystalline silicon layer. The semiconductor layer 31 is not separated between the memory cell transistors MT in the same memory pillar MP, and is continuously provided. Therefore, the channels formed in the two memory cell transistors MT share a part of the memory pillar MP.

As described above, the semiconductor layer 31 is continuous between two memory cell transistors MT facing each other. Therefore, the channels formed in the two memory cell transistors MT facing each other share a part of the memory pillar MP. Specifically, in FIGS. 7 and 8, the channel formed in a first memory cell and the channel formed in a second memory cell, which are provided in the memory cell transistor MT on a left side and the memory cell transistor MT on a right side facing each other, share a part of the memory pillars MP. Here, the sharing of a part of the memory pillar MP by the two channels means that the two channels are formed in the same memory pillar MP and that the two channels partially overlap each other.

The insulating layer 32 surrounds the periphery of the semiconductor layer 31 and functions as a gate insulating film of the memory cell transistor MT. The insulating layer 32 is formed of, for example, a stacked structure of a silicon oxide film and a silicon nitride film. The insulating layer 33 surrounds the periphery of the semiconductor layer 31 and functions as the charge storage layer of the memory cell transistor MT. The insulating layer 33 is formed of, for example, a silicon nitride film. The insulating layer 34 surrounds the periphery of the insulating layer 33 and functions as a block insulating film of the memory cell transistor MT. The insulating layer 34 is formed of, for example, a silicon oxide film. An insulating layer 37 is embedded in the slit SLT2 except at the memory pillar MP portion. The insulating layer 37 is formed of, for example, a silicon oxide film. The insulating layer 33 of the memory cell transistor MT on the left side and the insulating layer 33 of the memory cell transistor MT on the right side that face each other are connected by, for example, the insulating layer 33 including a silicon nitride film.

In the first example of the embodiment, for example, an AlO layer 35 is provided around the memory pillar MP. A barrier metal layer 36 is provided around the AlO layer 35. The barrier metal layer 36 is formed of, for example, a TiN film. The wiring layer 11 functioning as the word line WL is provided around the barrier metal layer 36. The wiring layer 11 is formed of, for example, a film made of tungsten as a material.

As a result, one memory pillar MP includes two memory cell transistors MT and MT or two select transistors ST1 and ST2 along the Y direction at a certain position on a Z axis.

Figure 9:
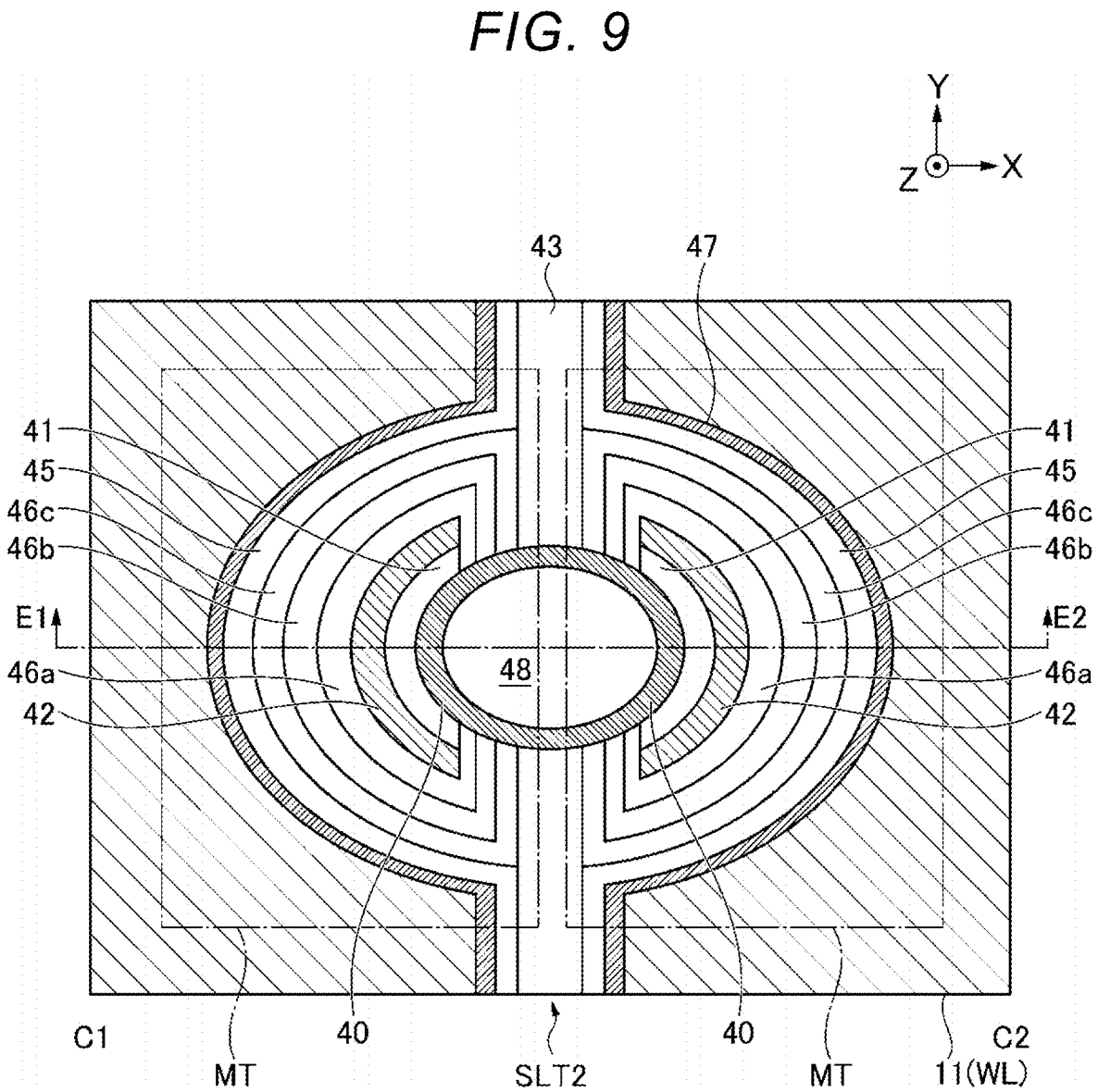
FIG. 9 is a cross-sectional view showing a modification example of the memory cell transistor shown in FIG. 7.
Figure 10:
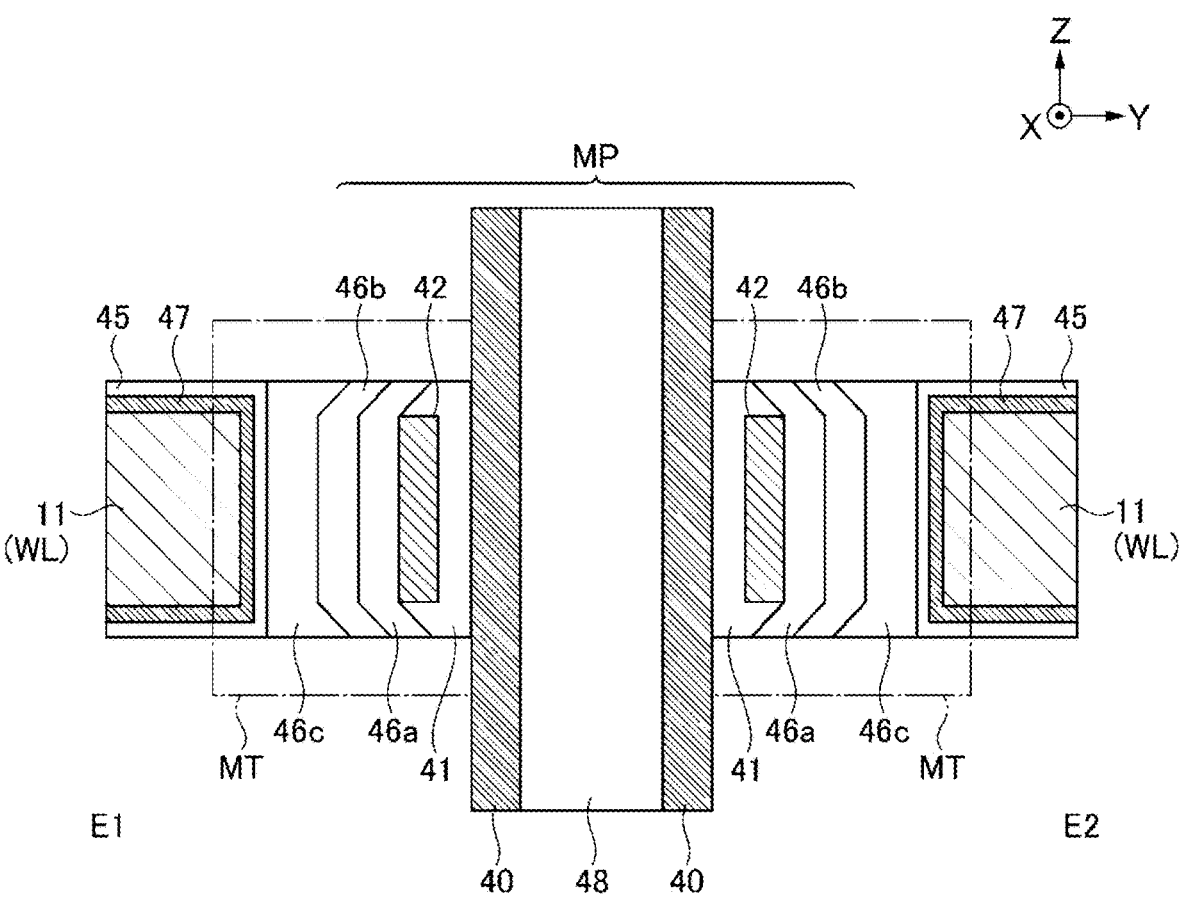
FIG. 10 is a view of an E1-E2 cross-section of the memory cell transistor shown in FIG. 9.
Figure 11:
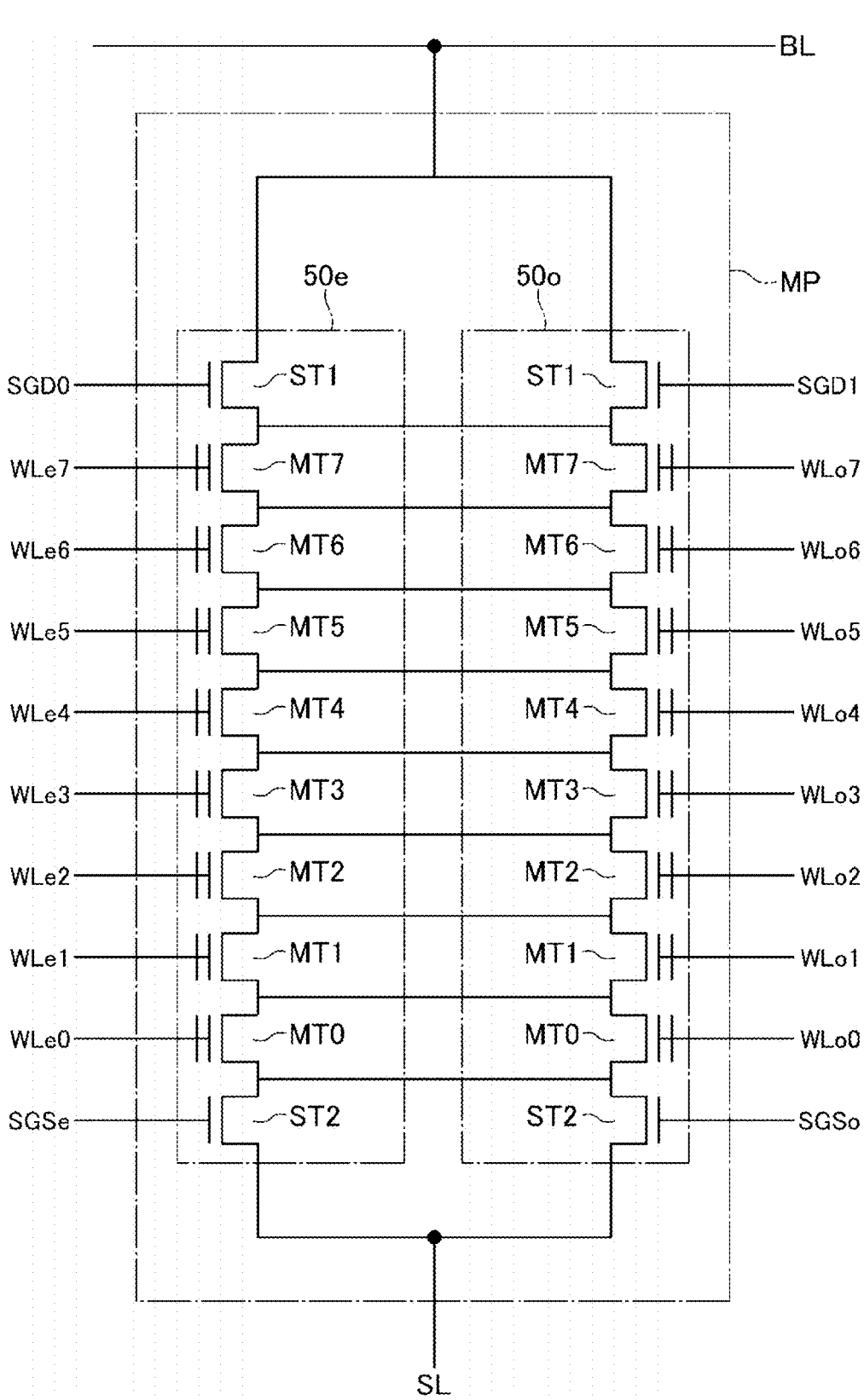
FIG. 11 is a diagram showing an equivalent circuit of a memory pillar in the semiconductor memory device according to the first embodiment.

FIG. 9 is a diagram showing a modification example (also referred to herein as the "second example") of the memory cell transistor shown in FIG. 7, and is a diagram showing the C1-C2 cross-section of the memory cell transistor shown in FIG. 5. FIG. 10 is a diagram showing an E1-E2 cross-section of the memory cell transistor shown in FIG. 9. FIGS. 9 and 10 are cross-sectional views showing a region including two memory cell transistors MT. In the second example, the charge storage layer provided in the memory cell transistor MT is a conductive film. In the description of FIGS. 10 and 11, the description of the configuration that is the same as or similar to the configuration of FIGS. 1 to 9 may be omitted.

As shown in FIGS. 10 and 11, the memory pillar MP includes an insulating layers 48 and 43, a semiconductor layer 40, an insulating layer 41, a conductive layer 42, and an insulating layers 46a to 46c, all of which extend in the Z direction. The insulating layer 48 is formed of, for example, a silicon oxide film. The semiconductor layer 40 surrounds the periphery of the insulating layer 48. The semiconductor layer 40 functions as a region where the channel of the memory cell transistor MT is formed. The semiconductor layer 40 is formed of, for example, a polycrystalline silicon layer. The semiconductor layer 40 is not separated between the memory cell transistors MT in the same memory pillar MP and is continuously provided, as in the first example of the memory pillar MP shown in FIG. 8.

The insulating layer 41 is provided around the semiconductor layer 40 and functions as the gate insulating film of each of the memory cell transistors MT. The insulating layer 41 is separated into two regions in the XY plane shown in FIG. 10. Each of the two regions separated by the insulating layer 41 functions as the gate insulating film of the two memory cell transistors MT in the same memory pillar MP. The insulating layer 41 is formed of, for example, a stacked structure of a silicon oxide film and a silicon nitride film.

The conductive layer 42 is provided around the insulating layer 41 and is separated into two regions along the Y direction by the insulating layer 43. Each of the two regions of the conductive layer 42 separated from each other functions as the charge storage layer of each of the two memory cell transistors MT. The conductive layer 42 is formed of, for example, a polycrystalline silicon layer.

The insulating layer 43 is formed of, for example, a silicon oxide film. Insulating layers 46a, 46b, and 46c are sequentially provided around the conductive layer 42 from a side close to the conductive layer 42. The insulating layers 46a and 46c are formed of, for example, a silicon oxide film, and the insulating layer 46b is formed of, for example, a silicon nitride film. The insulating layers 46a, 46b, and 46c function as the block insulating film of the memory cell transistor MT. The insulating layers 46a, 46b, and 46c are separated into two regions along the Y direction. The insulating layer 43 is provided between the insulating layers 46c, which are separated into two regions. In addition, the insulating layer 43 is embedded in the slit SLT2.

In the second example of the present embodiment, for example, an AlO layer 45 is provided around the memory pillar MP. A barrier metal layer 47 is provided around the AlO layer 45. The barrier metal layer 47 is formed of, for example, a TiN film. The wiring layer 11 functioning as the word line WL is provided around the barrier metal layer 47. Similarly to the first example of the memory pillar MP according to the present embodiment, the wiring layer 11 of the second example of the memory pillar MP according to the present embodiment is formed of, for example, a film formed of tungsten as a material.

Also in the second example of the memory pillar MP according to the present embodiment, similarly to the first example of the memory pillar MP, one memory pillar MP includes two memory cell transistors MT and MT or two select transistors ST1 and ST2 along the Y direction at a certain position on the Z axis. It should be noted that an insulating layer is provided between the memory cell transistors adjacent to each other in the Z direction, although not shown. Such insulating layer, the insulating layer 43, and the insulating layer 46 insulate the conductive layer 42 for each individual memory cell transistor.

FIG. 11 is an equivalent circuit diagram of a memory pillar (two adjacent NAND strings) in the semiconductor memory device 1 according to the present embodiment. In the description of FIG. 11, the description of the configuration that is the same as or similar to the configuration of FIGS. 1 to 10 may be omitted.

As shown in FIG. 11, two NAND strings 50e and 500 are formed in one memory pillar MP. Each of the NAND strings 50c and 500 has the select transistor ST1, the memory cell transistors MT0 to MT7, and the select transistor ST2 that are electrically connected in series. The NAND string 50c and the NAND string 500 face each other (are opposed to each other). Therefore, the select transistors ST1, the memory cell transistors MT0 to MT7, and the select transistors ST2 provided in the NAND string 50c and the select transistors ST1, the memory cell transistors MT0 to MT7, and the select transistors ST2 provided in the NAND string 500 face each other (are opposed to each other) in a one-to-one manner. Specifically, the select transistor ST1 provided in the NAND string 50c and the select transistor ST1 provided in the NAND string 500 face each other, the memory cell transistors MT0 to MT7 provided in the NAND string 50c and the memory cell transistors MT0 to MT7 provided in the NAND string 500 face each other in a one-to-one manner, and the select transistor ST2 provided in the NAND string 50e and the select transistor ST2 provided in the NAND string 500 face each other.

In the following description, mainly, an example including two memory pillars MP, that is, a first memory pillar MP (for example, MP4 in FIG. 4) and a second memory pillar MP (for example, MP0 in FIG. 4) adjacent to the first memory pillar MP will be described.

The select transistors ST1 of the NAND strings 50e provided in the first memory pillar MP and the second memory pillar MP are connected to, for example, a common select gate line SGD0. The select transistors ST1 of the NAND strings 500 provided in the first memory pillar MP and the second memory pillar MP are connected to, for example, a common select gate line SGD1. The memory cell transistors MT0 to MT7 of the NAND string 50e provided in the first memory pillar MP and the second memory pillar MP are connected to common word lines WLe0 to WLe7, respectively. The memory cell transistors MT0 to MT7 of the NAND string 500 provided in the first memory pillar MP and the second memory pillar MP are connected to common word lines WLo0 to WLo7, respectively. The select transistors ST2 of the NAND strings 50c provided in the first memory pillar MP and the second memory pillar MP are connected to, for example, a common even select gate line SGSe. The select transistors ST2 of the NAND strings 500 provided in the first memory pillar MP and the second memory pillar MP are connected to, for example, a common odd select gate line SGSo.

As described above, the select transistor ST1, the memory cell transistors MT0 to MT7, and the select transistor ST2 provided in the NAND string 50e and the select transistor ST1, the memory cell transistors MT0 to MT7, and the select transistor ST2 provided in the NAND string 500 correspond to each other. In the two transistors facing each other, the sources and the drains are electrically connected to each other. Specifically, in the NAND strings 50c and 500, the sources and the drains of the select transistors ST1 facing each other are electrically connected to each other, the sources and the drains of the memory cell transistors MT0 to MT7 facing each other are electrically connected to each other, and the sources and the drains of the select transistors ST2 facing each other are electrically connected to each other. This is because the channels formed in the transistors facing each other share a part of the memory pillar MP.

The two NAND strings 50e and 500 in the same memory pillar MP are connected to the same bit line BL and the same source line SL.

A state where the select gate line SGD is selected will be described with reference to FIGS. 3 and 4. When any of the select gate lines SGD0 to SGD3 is selected, a voltage for turning on the select transistor ST1 is supplied to one wiring layer 10-0 to 10-3 corresponding to each select gate line. For example, when the wiring layer 10-1 is selected, the eight select transistors ST1 provided in the memory pillars MP0, MP1, MP4, MP5, MP8, MP9, MP12, and MP13 are turned on. As a result, the eight memory cell transistors MT belonging to the above-described memory pillars are selected. That is, one page is formed by the above-described eight memory cell transistors MT. Since the operation when the wiring layer other than the above-described wiring layer 10-1 is selected is the same as the above, the description thereof will be omitted.

In the present embodiment, for example, the TLC method is applied as a write method of the memory cell transistor MT. A plurality of memory cell transistors MT to which the TLC method is applied form eight threshold voltage distributions (write states). The eight threshold voltage distributions are referred to, for example, as an "Er" state, an "A" state, a "B" state, a "C" state, a "D" state, an "E" state, an "F" state, and a "G" state in order of increasing threshold voltages. Different 3-bit data is assigned to the "Er" state, the "A" state, the "B" state, the "C" state, the "D" state, the "E" state, the "F" state, and the "G" state.

The semiconductor memory device 1 according to the present embodiment repeatedly executes a program loop in the write operation. The program loop includes, for example, a program operation and a verify operation. The program operation is an operation of increasing a threshold voltage of the selected memory cell transistor MT by injecting an electron into the charge storage layer in the selected memory cell transistor MT. Alternatively, the program operation is an operation of maintaining the threshold voltage of the selected memory cell transistor MT by prohibiting the injection of the electron into the charge storage layer. The verify operation is an operation of verifying whether the threshold voltage of the selected memory cell transistor MT reaches a target state by an operation of performing a read using a verify voltage after the program operation. The selected memory cell transistor MT in which the threshold voltage reaches the target state is then prohibited from writing.

In the semiconductor memory device 1 according to the present embodiment, the threshold voltage of the selected memory cell transistor MT is increased to the target state by repeatedly executing the program loop including the program operation and the verify operation as described above.

The electrons stored in the charge storage layer may be in an unstable state. Therefore, the electrons stored in the charge storage layer of the memory cell transistor MT may leak from the charge storage layer over time from a point in time at which the program operation described above is completed. When the electrons leak from the charge storage layer, the threshold voltage of the memory cell transistor MT is decreased. Therefore, in the read operation executed after the completion of the write operation, the read operation is performed using a read voltage lower than the verify voltage in order to cope with such a decrease in the threshold voltage of the memory cell transistor, which may occur over time.

Figure 13:
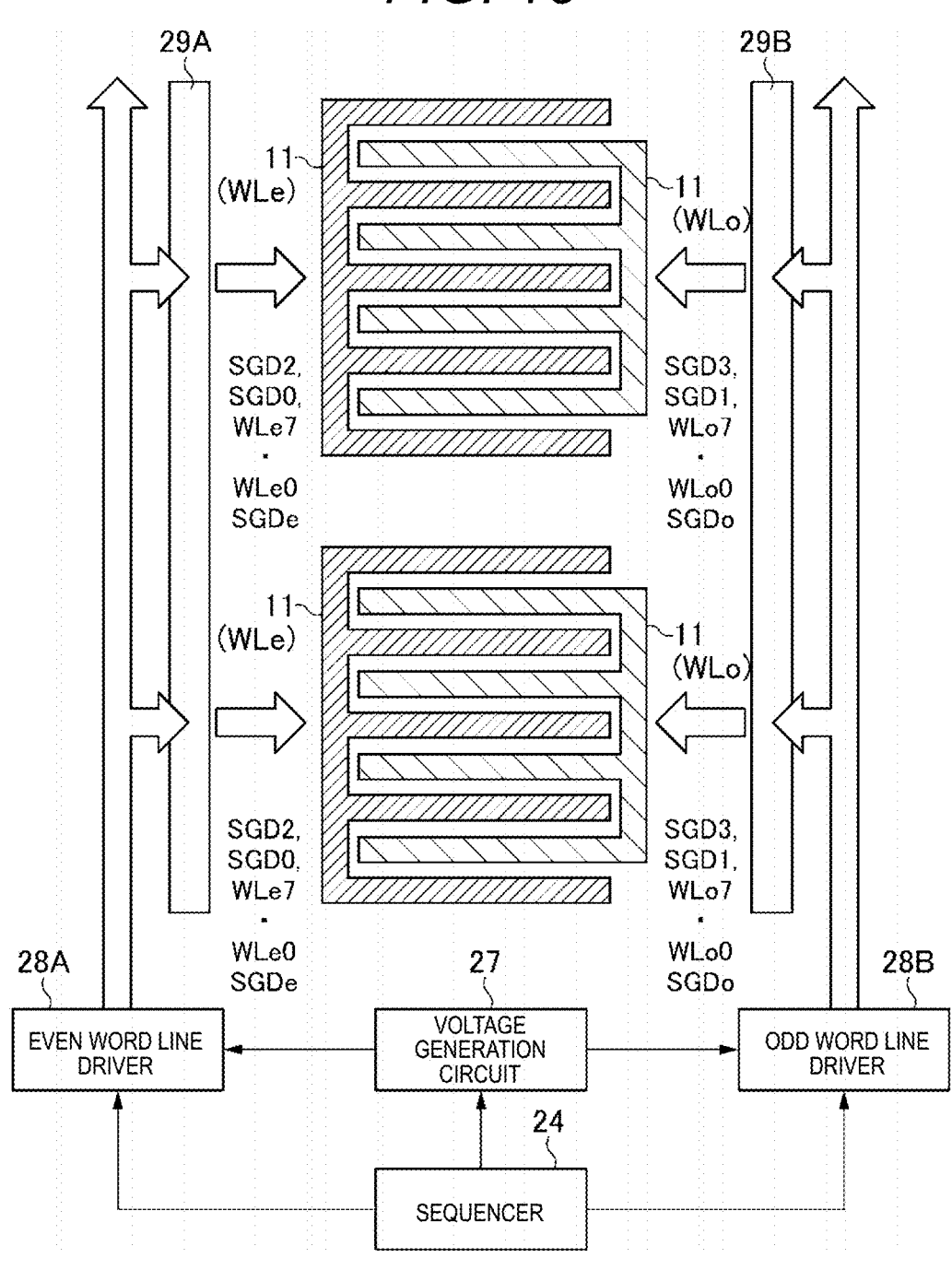
FIG. 13 is a diagram illustrating the electrical connection of the voltage generation circuit, the driver set, the select gate line, or the word line in the semiconductor memory device according to the first embodiment.

FIGS. 12 and 13 are diagrams illustrating the electrical connection of the sequencer 24, the voltage generation circuit 27, the driver set 28, the row decoder 29, the select gate line SGD, or the word line WL according to the present embodiment. The electrical connection of the sequencer 24, the voltage generation circuit 27, the driver set 28, the row decoder 29, the select gate line SGD, or the word line WL according to the present embodiment is not limited to the configuration shown in FIG. 12. In the description of FIGS. 12 and 13, the description of the configuration that is the same as or similar to the configuration of FIGS. 1 to 11 may be omitted. A circuit including the sequencer 24, the voltage generation circuit 27, the driver set 28, and the row decoder 29 is an example of a control circuit.

As shown in FIG. 12, the wiring layer 11 functioning as the even word line WLe may be connected to the even word line driver 28A, and the wiring layer 11 functioning as the odd word line WLo may be electrically connected to the odd word line driver 28B. As described above, the even word line driver 28A and the odd word line driver 28B are provided in the driver set 28. The driver set 28 is electrically connected to the voltage generation circuit 27. As shown in FIGS. 12 and 13, the even word line driver 28A and the odd word line driver 28B may generate various voltages by using the voltage supplied from the voltage generation circuit 27. The even word line driver 28A may supply the generated voltage to the even word line WLe of each block BLK via a row decoder 29A. In addition, the odd word line driver 28B may supply the generated voltage to the odd word line WLo of each block BLK via a row decoder 29B. The row decoder 29A and the row decoder 29B are provided in the row decoder 29.

As shown in FIG. 13, as described above, the sequencer 24 can control the driver set 28 and the like to execute various operations, such as the write operation and the read operation.

Figure 14:
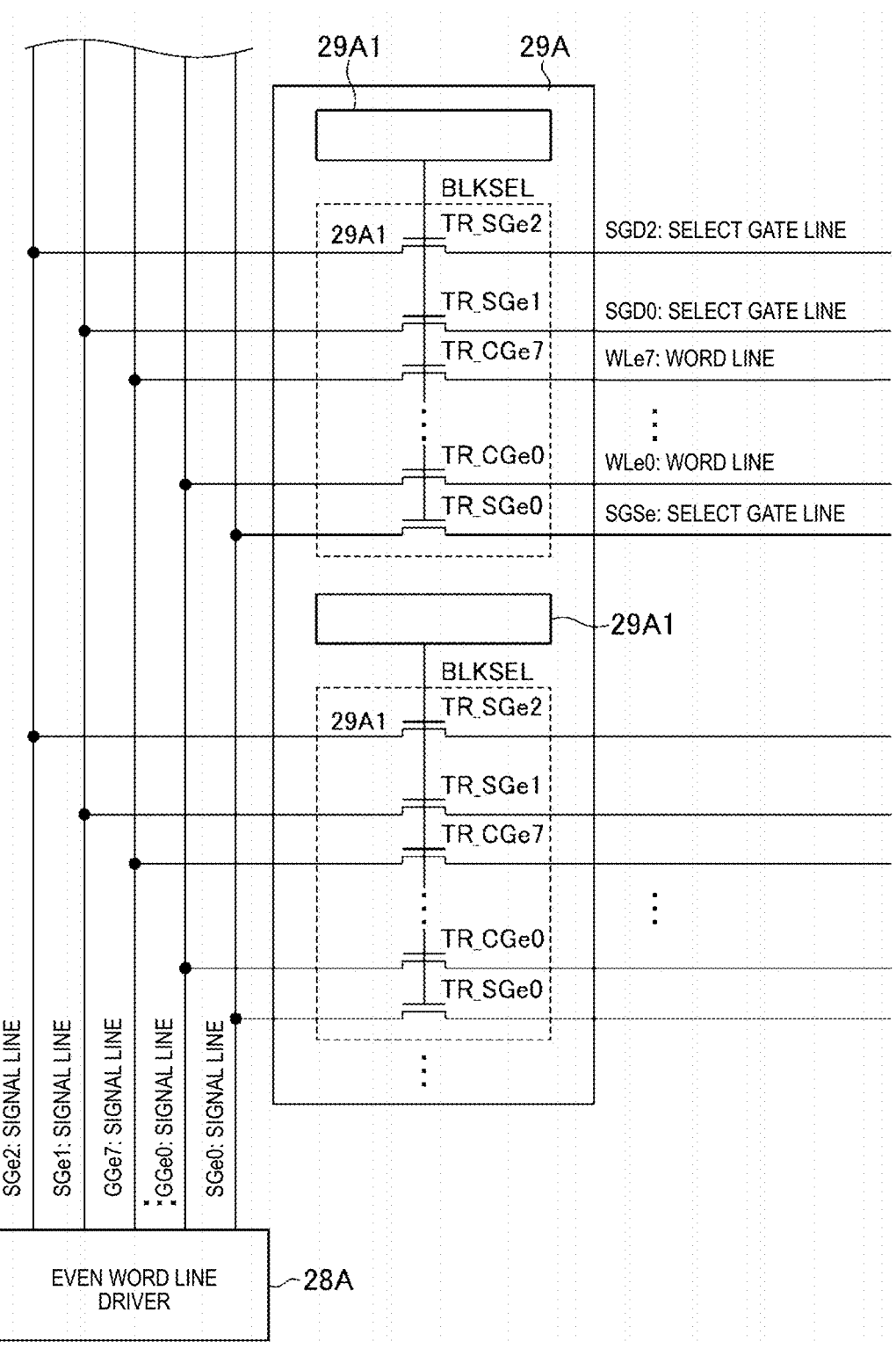
FIG. 14 is a schematic diagram illustrating an electrical connection between an even word line driver and a row decoder in the semiconductor memory device according to the first embodiment.

FIG. 14 is a schematic diagram illustrating the electrical connection between the even word line driver 28A and the row decoder 29A according to the present embodiment.

A signal line SGe0, a signal line SGe1, a signal line SGe2, and signal lines CGe0 to CGe7 as signal lines CGe, are connected to the even word line driver 28A. For the signal line CGe, for example, the same number of signal lines CGe as the number of even word lines WL disposed in the Z direction in the block BLK are connected.

The signal line SG0 is connected to the even select gate line SGSe in each of the blocks BLK via a transistor TR_SGc0. The transistor TR_SGe0 functions as a switch for turning on and off a signal from the signal line SGe0 by a block decoder 29A1.

The signal lines CGe0 to CGe7 are connected to the even word lines WLe0 to WLe7 in each of the blocks BLK via transistors TR_CGe0 to TR_CGe7. The transistors TR_CGe0 to TR_CGe7 function as switches for turning on and off signals from the signal lines CGe0 to CGe7 by the block decoder 29A1.

The signal line SGe1 is connected to the select gate line SGD0 in each of the blocks BLK via a transistor TR_SGe1. The transistor TR_SGe1 functions as a switch for turning on and off a signal from the signal line SGe1 by the block decoder 29A1.

The signal line SGe2 is connected to the select gate line SGD2 in each of the blocks BLK via a transistor TR_SGe2. The transistor TR_SGe2 functions as a switch for turning on and off a signal from the signal line SGe2 by the block decoder 29A1.

Figure 15:
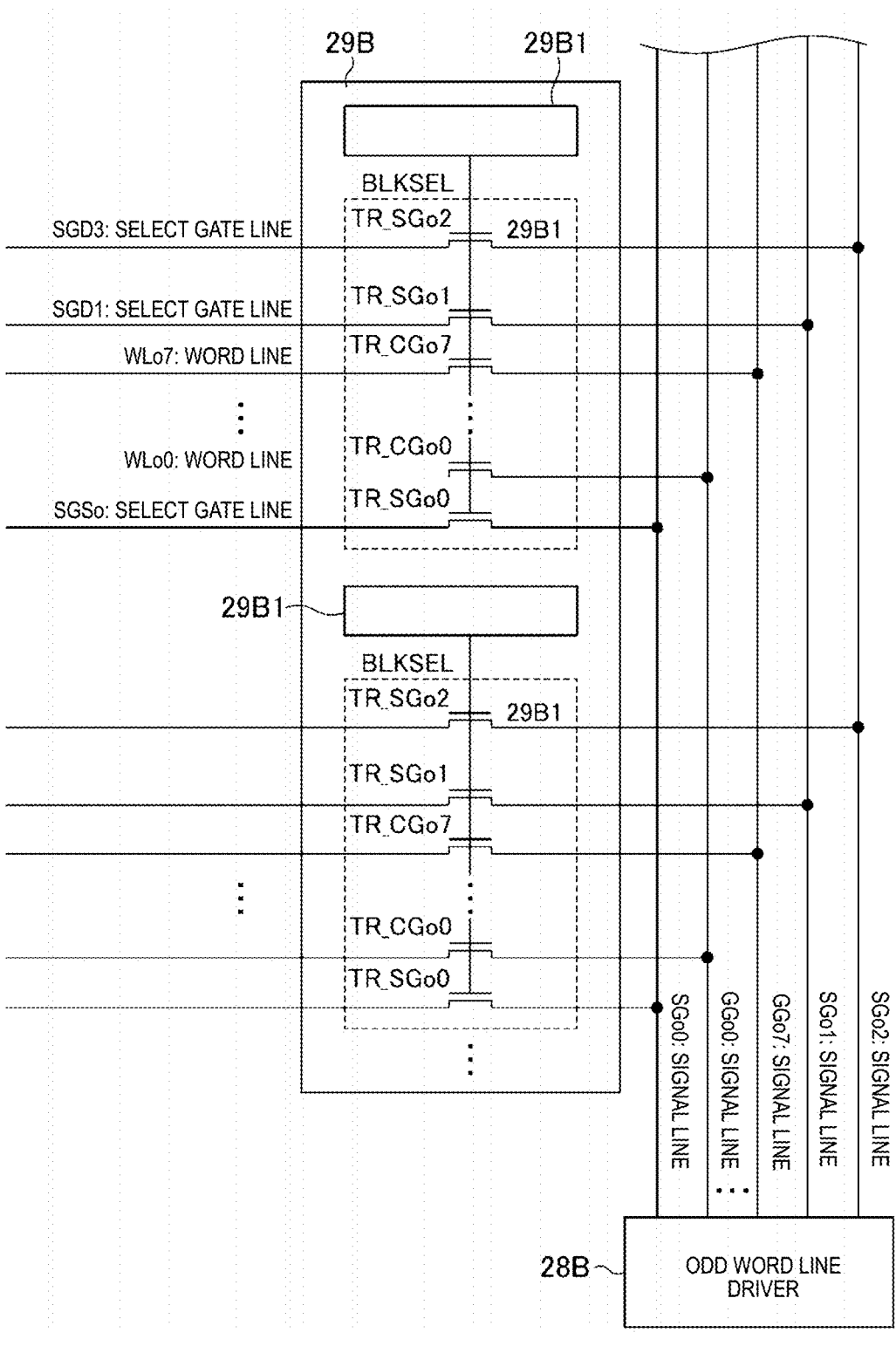
FIG. 15 is a schematic diagram illustrating an electrical connection between an odd word line driver and the row decoder in the semiconductor memory device according to the first embodiment.

FIG. 15 is a schematic diagram illustrating the electrical connection between the odd word line driver 28B and the row decoder 29B according to the present embodiment.

A signal line SGo0, a signal line SGo1, a signal line SGo2, and signal lines CGo0 to CGo7 as signal lines CGo are connected to the odd word line driver 28B. For the signal line CGo, for example, the same number of signal lines CGo as the number of odd word lines WL disposed in the Z direction in the block BLK are connected.

The signal line SGo is connected to the odd select gate line SGSo in each of the blocks BLK via a transistor TR_SGo0. The transistor TR_SGo0 functions as a switch for turning on and off a signal from the signal line SGo0 by a block decoder 29B1.

The signal lines CGo0 to CGo7 are connected to the odd word lines WLo0 to WLo7 in each of the blocks BLK via transistors TR_CGo0 to TR_CGo7. The transistors TR_CGo0 to TR_CGo7 function as switches for turning on and off signals from the signal lines CGo0 to CGo7 by the block decoder 29B1.

The signal line SGo1 is connected to the select gate line SGD1 in each of the blocks BLK via a transistor TR_SGo1. The transistor TR_SGo1 functions as a switch for turning on and off a signal from the signal line SGo1 by a block decoder 29B1.

The signal line SGo2 is connected to the select gate line SGD3 in each of the blocks BLK via a transistor TR_SGo2. The transistor TR_SGo1 functions as a switch for turning on and off a signal from the signal line SGo2 by a block decoder 29B1.

Although not shown in FIGS. 14 and 15, the select gate line SGD and the select gate line SGSe are provided with a mechanism that can be connected to a ground voltage (Vss) during non-operation.

Figure 16:
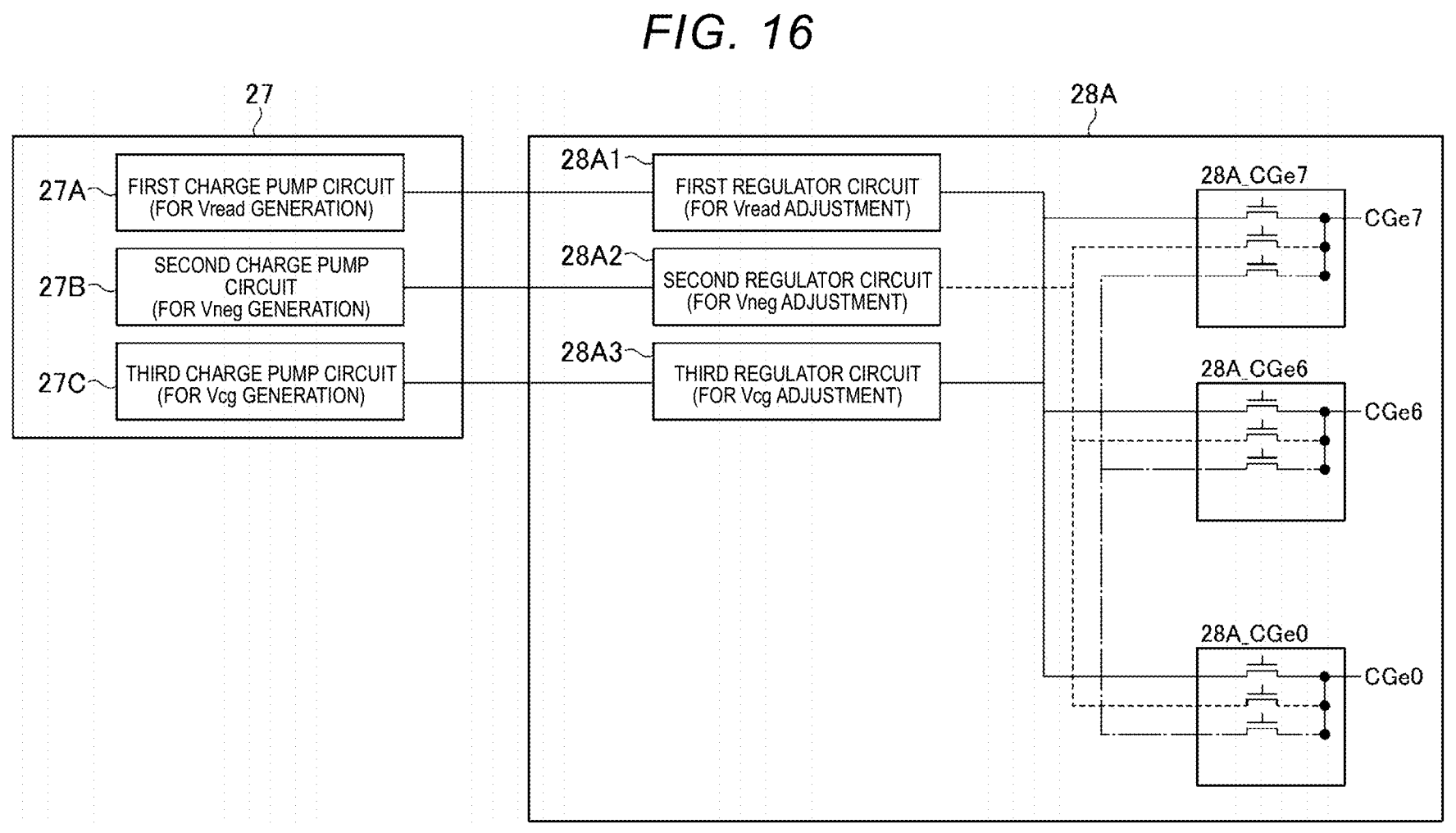

FIG. 16 is a schematic diagram illustrating the electrical connection between the voltage generation circuit 27 and the even word line driver 28A according to the present embodiment.

Vread, Vneg, and Veg as voltages, which will be described later, are generated by, for example, a first charge pump circuit 27A, a second charge pump circuit 27B, and a third charge pump circuit 27C in the voltage generation circuit 27, respectively. Vread, Vneg, and Veg are stored by a first regulator circuit 28A1, a second regulator circuit 28A2, and a third regulator circuit 28A3 in the even word line driver 28A, respectively. Thereafter, Vread, Vneg, and Veg are appropriately added, and supplied to the signal lines CGe0 to CGe7.

Figure 17:
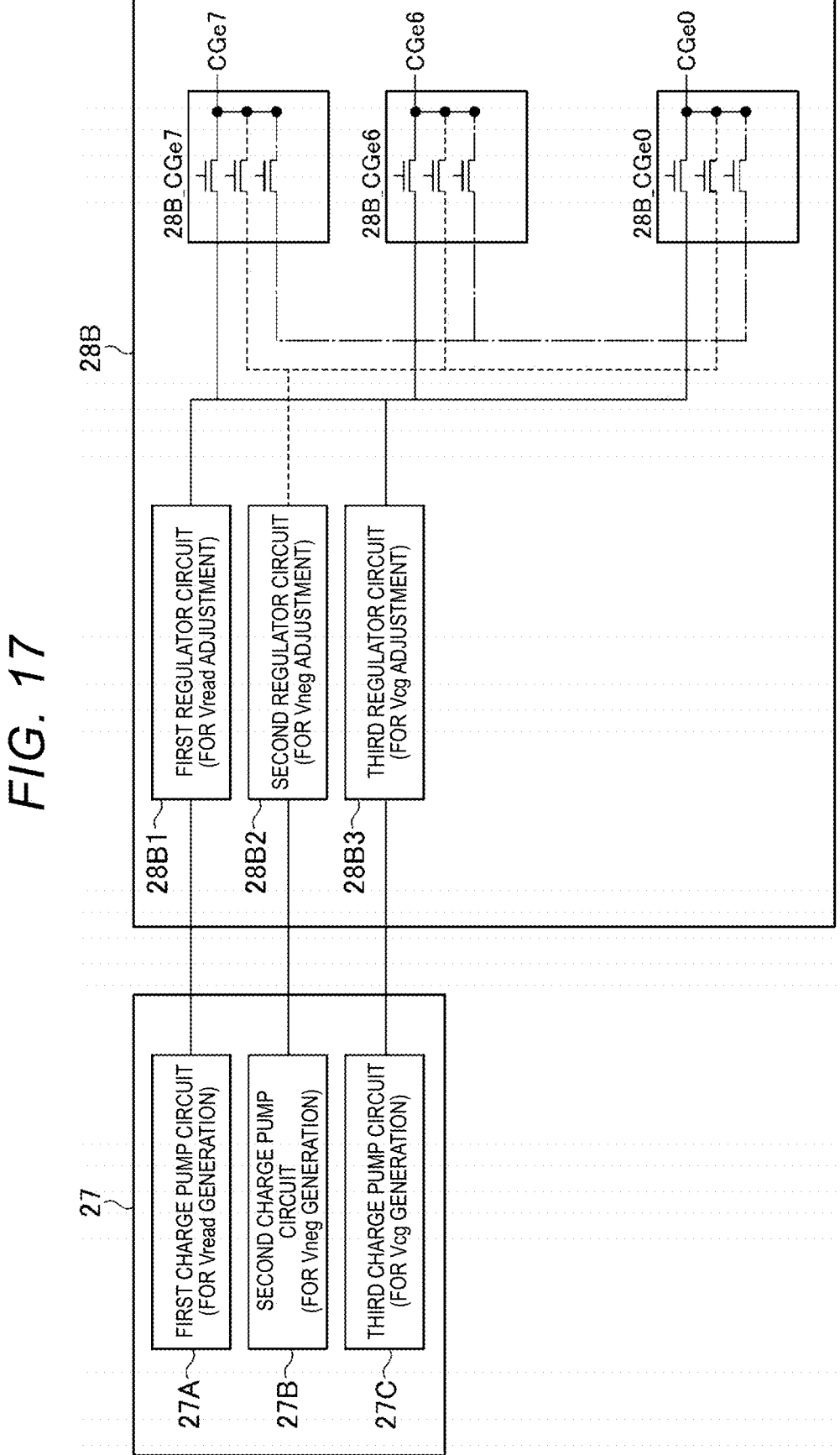
FIG. 17 is a schematic diagram illustrating an electrical connection between the voltage generation circuit and the odd word line driver in the semiconductor memory device according to the first embodiment.

FIG. 17 is a schematic diagram illustrating the electrical connection between the voltage generation circuit 27 and the odd word line driver 28B according to the present embodiment.

The Vread, the Vneg, and the Veg are stored by a first regulator circuit 28B1, a second regulator circuit 28B2, and a third regulator circuit 28B3 in the odd word line driver 28B, respectively. Thereafter, Vread, Vneg, and Veg are appropriately added, and supplied to the signal lines CGc0 to CGe7.

Figure 18:
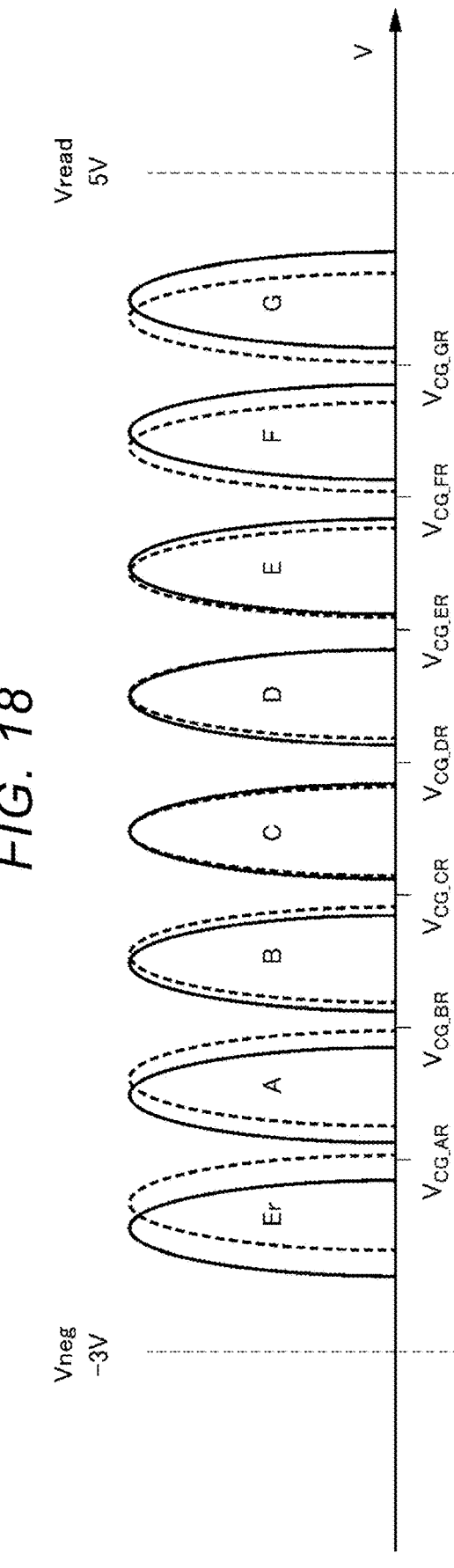
FIG. 18 is a diagram schematically showing a variation in a threshold voltage of the memory cell transistor in the semiconductor memory device according to the first embodiment.

FIG. 18 is a diagram schematically showing a variation in the threshold voltage of the memory cell transistor in the semiconductor memory device according to the first embodiment.

An effective threshold voltage of the memory cell transistor MT may vary after the read operation is completed and the connection of the signal lines CGe0 to CGe7 and the even word lines WLe0 to WLe7 is turned off by the transistors TR_CGe0 to TR_CGe7.

For example, as shown in FIG. 18 by using a broken line, the threshold voltages of the memory cell transistors MT at the "Er" state, the "A" state, and the "B" state are effectively increased. In this case, for example, an amount of change in the threshold voltage at the "Er" state is larger than an amount of change in the threshold voltage at the "A" state. In addition, the amount of change in the threshold voltage at the "A" state is larger than an amount of change in the threshold voltage at the "B" state.

In addition, for example, as shown in FIG. 18 using a broken line, the threshold voltages of the memory cell transistors MT at the "E" state, the "F" state, and the "G" state are effectively decreased. In this case, for example, an amount of change in the threshold voltage at the "G" state is larger than an amount of change in the threshold voltage at the "F" state. In addition, the amount of change in the threshold voltage at the "F" state is larger than an amount of change in the threshold voltage at the "E" state. The effective change in the threshold voltage is not limited to the change shown in FIG. 18.

When the read operation is performed in a state where the threshold voltage is effectively changed, the accuracy of the read operation is decreased.

Vread is higher than the threshold voltage of the memory cell transistor MT at the "G" state. Vread is a voltage for turning on the memory cell transistor MT regardless of the data stored in the memory cell transistor MT. Vread is, for example, 5 V. It should be noted that Vread is not limited to 5 V.

In addition, Vneg is lower than the threshold voltage of the memory cell transistor MT at the "Er" state. Vneg is a voltage for turning off the memory cell transistor MT regardless of the stored data of the memory cell transistor MT. Vneg is, for example, −3 V. It should be noted that Vneg is not limited to −3 V.

Figure 19:
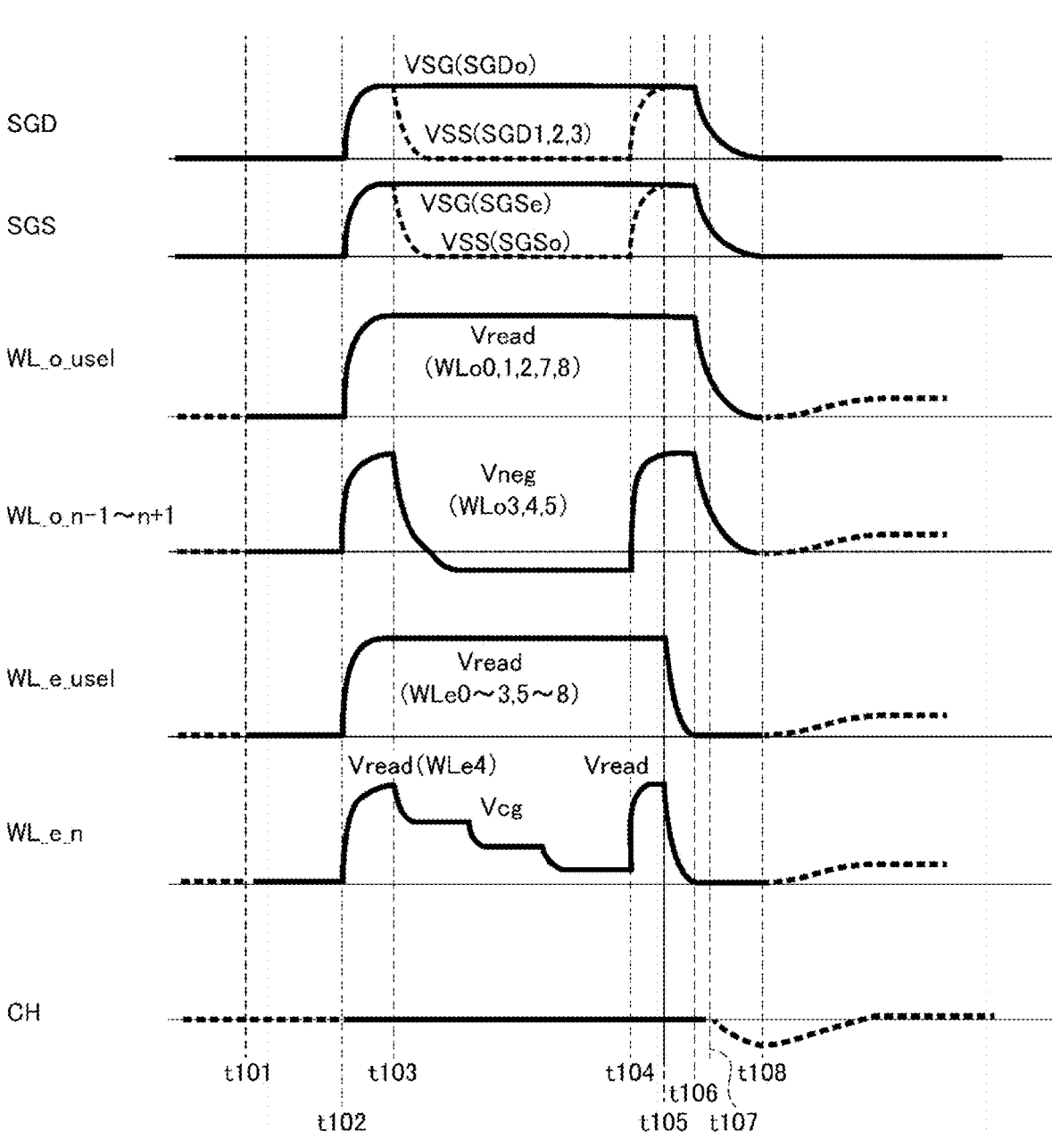
FIG. 19 is a diagram schematically showing a timing chart of various signals during a data read operation in the semiconductor memory device according to the first embodiment.

FIG. 19 is a diagram schematically showing a timing chart of various signals during the data read operation in the semiconductor memory device according to the present embodiment.

An example of the read operation in the semiconductor memory device according to the present embodiment will be described. In the following description, the memory cell transistor MT in which the control gate is connected to the word line WLe4 (an example of a word line WL_e_n) is referred to as the memory cell transistor MT4 of the NAND string 50c, the memory cell transistor MT in which the control gate is connected to the word line WLe5 (an example of a word line WL_e_n+1) is referred to as the memory cell transistor MT5 of the NAND string 50c, the memory cell transistor MT in which the control gate is connected to the word line WLe6 (an example of a word line WL_e_n+2) is referred to as the memory cell transistor MT6 of the NAND string 50c, the memory cell transistor MT in which the control gate is connected to the word line WLe3 (an example of a word line WL_e_n−1) is referred to as the memory cell transistor MT3 of the NAND string 50c, the memory cell transistor MT in which the control gate is connected to the word line WLe2 (an example of a word line WL_e_n−2) is referred to as the memory cell transistor MT2 of the NAND string 50c, the memory cell transistor MT in which the control gate is connected to the word line WLo4 (an example of a word line WL_o_n) is referred to as the memory cell transistor MT4 of the NAND string 500, the memory cell transistor MT in which the control gate is connected to the word line WLo5 (an example of a word line WL_o_n+1) is referred to as the memory cell transistor MT5 of the NAND string 500, the memory cell transistor MT in which the control gate is connected to the word line WLo6 (an example of a word line WL_o_n+2) is referred to as the memory cell transistor MT6 of the NAND string 500, the memory cell transistor MT in which the control gate is connected to the word line WLo3 (an example of a word line WL_o_n−1) is referred to as the memory cell transistor MT3 of the NAND string 500, and the memory cell transistor MT in which the control gate is connected to the word line WLo2 (an example of a word line WL_o_n−1) is referred to as the memory cell transistor MT2 of the NAND string 500.

Hereinafter, as an example, an example of the read operation executed with respect to the memory cell transistor MT4 belonging to the string unit SU0 selected by the select gate line SGD0 and the select gate line SGSe and connected to the word line WLe4 is shown.

Hereinafter, in the read operation of the memory cell transistor MT4 of the NAND string 50c, which is connected to the word line WLe4, for example, a first operation, a second operation, a third operation, a fourth operation, a fifth operation, a sixth operation, and a seventh operation are performed. Here, in the present embodiment, the second operation is performed after the first operation. In addition, the third operation is performed after the second operation. In addition, the fourth operation is performed after the third operation. In addition, the fifth operation is performed after the fourth operation. In addition, the sixth operation is performed after the fourth operation. In addition, the seventh operation is performed after the sixth operation.

First, the first operation is performed at time point 101. The first operation is an operation of starting the read operation. Specifically, the block decoder 29A1 corresponding to the block BLK that is an operation target outputs a high-level block selection signal BLKSEL to turn on the TR_CGe0 to TR_CGe7, and the signal line CGe and the word line WLe are connected to each other. In addition, the block decoder 29B1 corresponding to the block BLK that is the operation target outputs the high-level block selection signal BLKSEL to turn on the TR_CGo0 to TR_CGo7, and the signal line CGo and the word line WLo are connected to each other.

Next, the second operation is performed at time point 102. Specifically, the voltage generation circuit 27 applies Vsg to the select gate line SGSe, the select gate line SGSo, the select gate line SGD0, the select gate line SGD1, the select gate line SGD2, and the select gate line SGD3. Vsg is a voltage for turning on the select transistors ST1 and ST2 connected to the select gate lines SGSe, SGSo, SGD0, SGD1, SGD2, and SGD3.

As described above, when the read operation is executed with respect to the memory cell transistor MT4 that belongs to the string unit SU0 selected by the select gate line SGD0 and the select gate line SGSe and that is connected to the word line WLe4, the NAND string 50c is the NAND string selected (selected SU), and the NAND string 500 is the NAND string not selected (non-selected SU).

In addition, in the second operation, Vread is applied to the word line WLe0, the word line WLe1, the word line WLe2, the word line WLe3, the word line WLe4, the word line WLe5, the word line WLe6, the word line WLe7, the word line WLo0, the word line WLo1, the word line WLo2, the word line WLo3, the word line WLo4, the word line WLo5, the word line WLo6, and the word line WLo7.

The second operation is an operation of increasing the voltages of all the word lines WLe and the word lines WLo belonging to the block BLK that is the operation target to electrically connect the channel of the NAND string 50e and the channel of the NAND string 500 to the bit line BL and/or the source line SL, and to set a voltage of the channel of the NAND string 50c and a voltage of the channel of the NAND string 500 to a certain voltage.

Next, the third operation is performed at time point 103. Specifically, Vss is applied to the select gate line SGSo, the select gate line SGD1, the select gate line SGD2, and the select gate line SGD3. As a result, the select transistor ST1 of the NAND string 50e connected to the select gate line SGD2 is turned off, and the select transistor ST1 of the NAND string 500 connected to the select gate lines SGD1 and SGD3 is turned off. In addition, the select transistor ST2 of the NAND string 500 connected to the select gate line SGSo is turned off. In other words, the select transistors ST1 of the NAND strings 50e and 500 belonging to the string units SU1, SU2, and SU3 selected by the string units SU1, SU2, and SU3 are turned off. In addition, the select transistor ST2 of the NAND string 500 belonging to the string units SU1 and SU3 selected by the select gate line SGSo are turned off. In addition, Vss is a ground voltage. Vss is, for example, 0 V (0 volts).

In addition, in the third operation, Veg is applied to the word line WLe4. Veg is a read voltage used for the read operation. In FIG. 19, three types of different voltages are applied as Veg. The type of the voltage applied as Veg is not limited to three types.

In addition, in the third operation, Vneg is applied to the word line WLo3, the word line WLo4, and the word line WLo5.

The third operation is an operation of reading the information of the memory cell transistor MT4 belonging to the string unit SU0 and connected to the word line WLc4.

Next, the fourth operation is performed at time point 104. Specifically, Vsg is applied to the select gate line SGSo, the select gate line SGD1, the select gate line SGD2, and the select gate line SGD3. In addition, Vread is applied to the word line WLe4, the word line WLo3, the word line WLo4, and the word line WLo5.

The fourth operation is an operation of increasing the voltages of all the word lines WLe and the word lines WLo belonging to the block BLK that is the operation target to electrically connect the channel of the NAND string 50e and the channel of the NAND string 500 to the bit line BL and/or the source line SL, and to set the voltage of the channel of the NAND string 50c and the voltage of the channel of the NAND string 500 to the certain voltage again.

Next, the fifth operation is performed at time point 105. Specifically, the voltages of the word line WLe0, the word line WLe1, the word line WLe2, the word line WLe3, the word line WLe4, the word line WLe5, the word line WLe6, and the word line WLe7 are decreased. For example, the voltages of the word line WLe0, the word line WLe1, the word line WLe2, the word line WLe3, the word line WLe4, the word line WLe5, the word line WLe6, and the word line WLe7 are decreased to Vss.

Next, the sixth operation is performed at time point 106. Specifically, the voltages of the word line WLo0, the word line WLo1, the word line WLo2, the word line WLo3, the word line WLo4, the word line WLo5, the word line WLo6, and the word line WLo7 are decreased. For example, the voltages of the word line WLo0, the word line WLo1, the word line WLo2, the word line WLo3, the word line WLo4, the word line WLo5, the word line WLo6, and the word line WLo7 are decreased to Vss. In addition, Vss is applied to the select gate line SGSe, the select gate line SGSo, the select gate line SGD0, the select gate line SGD1, the select gate line SGD2, and the select gate line SGD3.

Next, the seventh operation is performed at time point 108. Specifically, the block decoder 29A1 corresponding to the block BLK that is the operation target sets the block selection signal BLKSEL to a low level to turn off TR_CGe0 to TR_CGe7, and the signal line CGe and the word line WLe are cut off. In addition, the block decoder 29B1 corresponding to the block BLK that is the operation target sets the block selection signal BLKSEL to a low level to turn off TR_CGo0 to TR_CGo7, and the signal line CGo and the word line WLo are cut off.

Next, the operation and effect of the semiconductor memory device of the present embodiment will be described.

Figure 22:
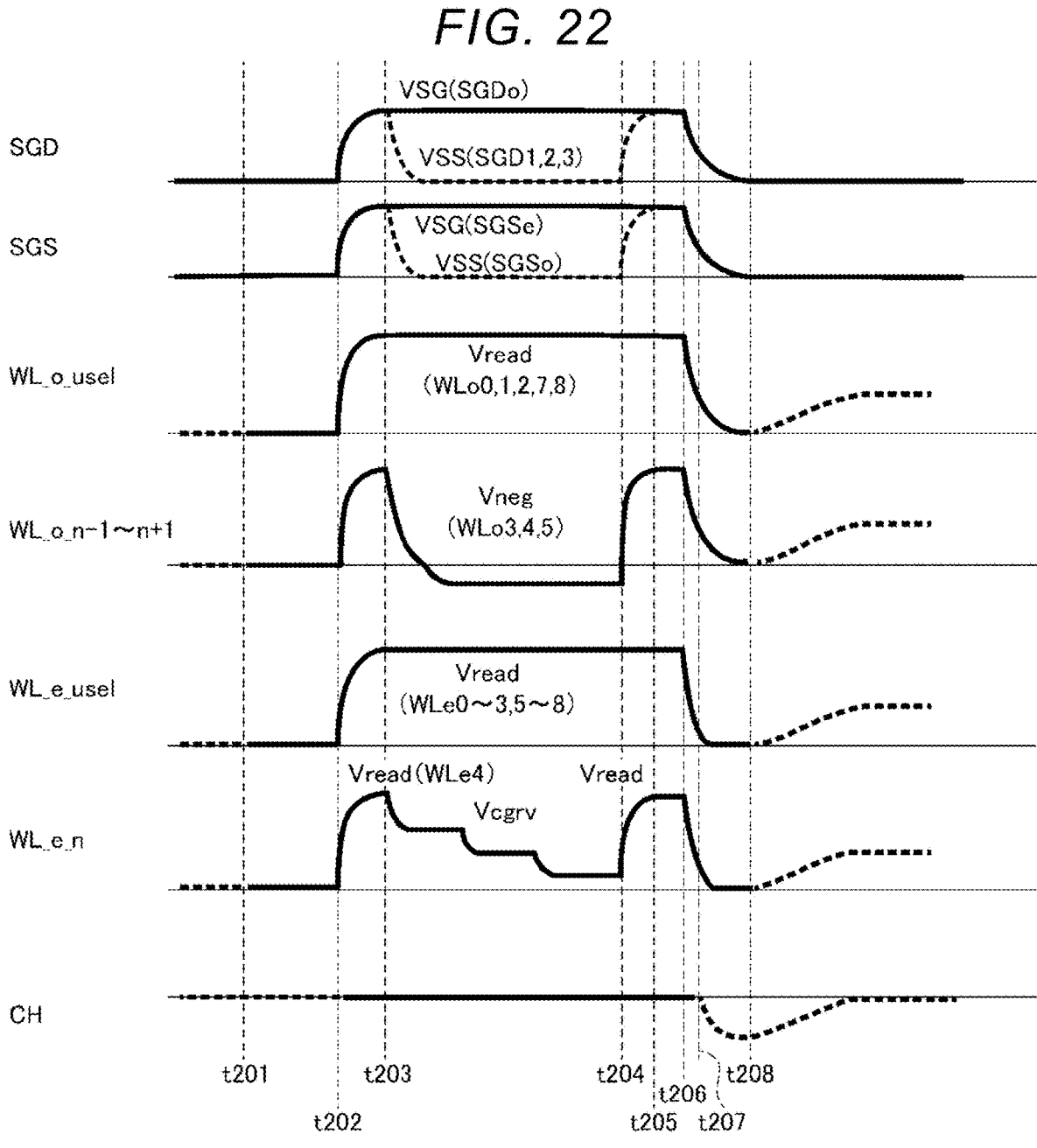
FIG. 22 is a diagram schematically showing a timing chart of various signals during the data read operation in the semiconductor memory device of a comparative example.

FIG. 22 is a diagram schematically showing a timing chart of various signals during the data read operation in the semiconductor memory device of a comparative example. The semiconductor memory device of the comparative example is different from the semiconductor memory device of the embodiment shown in FIG. 19 in that the fifth operation and the sixth operation are performed together.

That is, in the first embodiment, as shown in FIG. 19, the voltage of the word line WLe is decreased as the fifth operation at time point 105, and the voltages of the word line WLo, the select gate line SGD, and the select gate line SGS are decreased as the sixth operation at the subsequent time point 106. Meanwhile, in the comparative example, as shown in FIG. 22, the voltage of the word line WLe is decreased as the fifth operation at time point 206, and the voltages of the word line WLo, the select gate line SGD, and the select gate line SGS are decreased as the sixth operation at time point 206.

Figure 23:
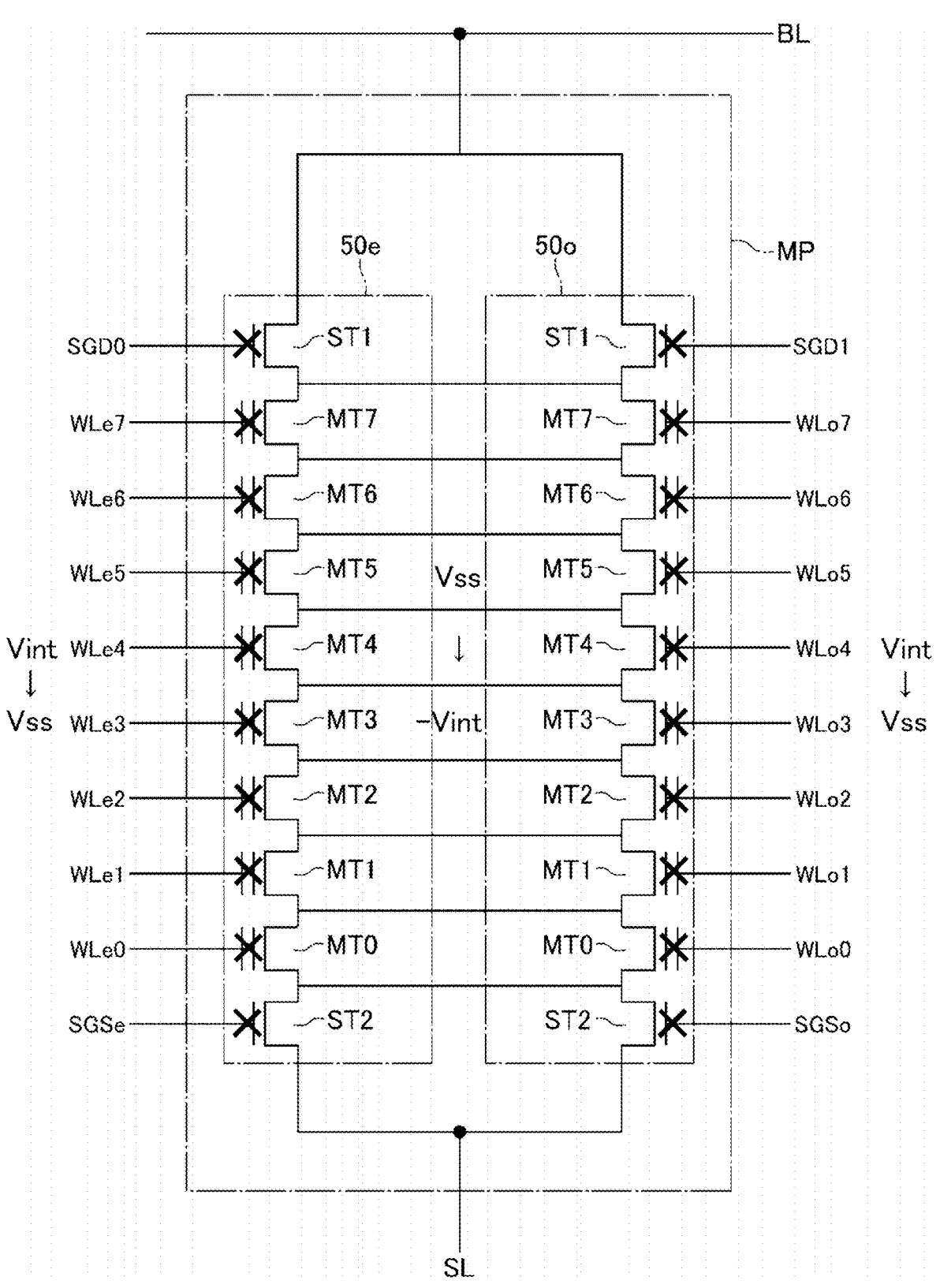
FIG. 23 is a diagram showing an example of the voltage in the semiconductor memory device of the comparative example.

When the voltage of the select gate line SG is decreased as the fifth operation and the sixth operation at time point 206, and then the voltage of the select gate line SG is lower than the threshold voltage of the select transistor ST at time point 207, as shown in FIG. 23, the select transistor ST is turned off. As a result, the channel of the NAND string 50e and the channel of the NAND string 500 enter a floating state. In this state, when the voltage of the word line WL is further decreased, the voltage of the channel of the NAND string 50e and the voltage of the channel of the NAND string 500 are further decreased via capacitance coupling between the word line WL and the channel, and become a negative voltage (voltage lower than the voltage Vss). For example, when the voltages of the word line WLe and the word line WLo at a point in time at which the select transistor ST is turned off are Vint, the voltages of the channel of the NAND string 50c and the channel of the NAND string 500 change to −Vint from Vss (0 V). That is, the channel of the NAND string 50c and the channel of the NAND string 500 enter a state where the electrons are left. The voltage Vint is a schematic voltage.

Figure 24:
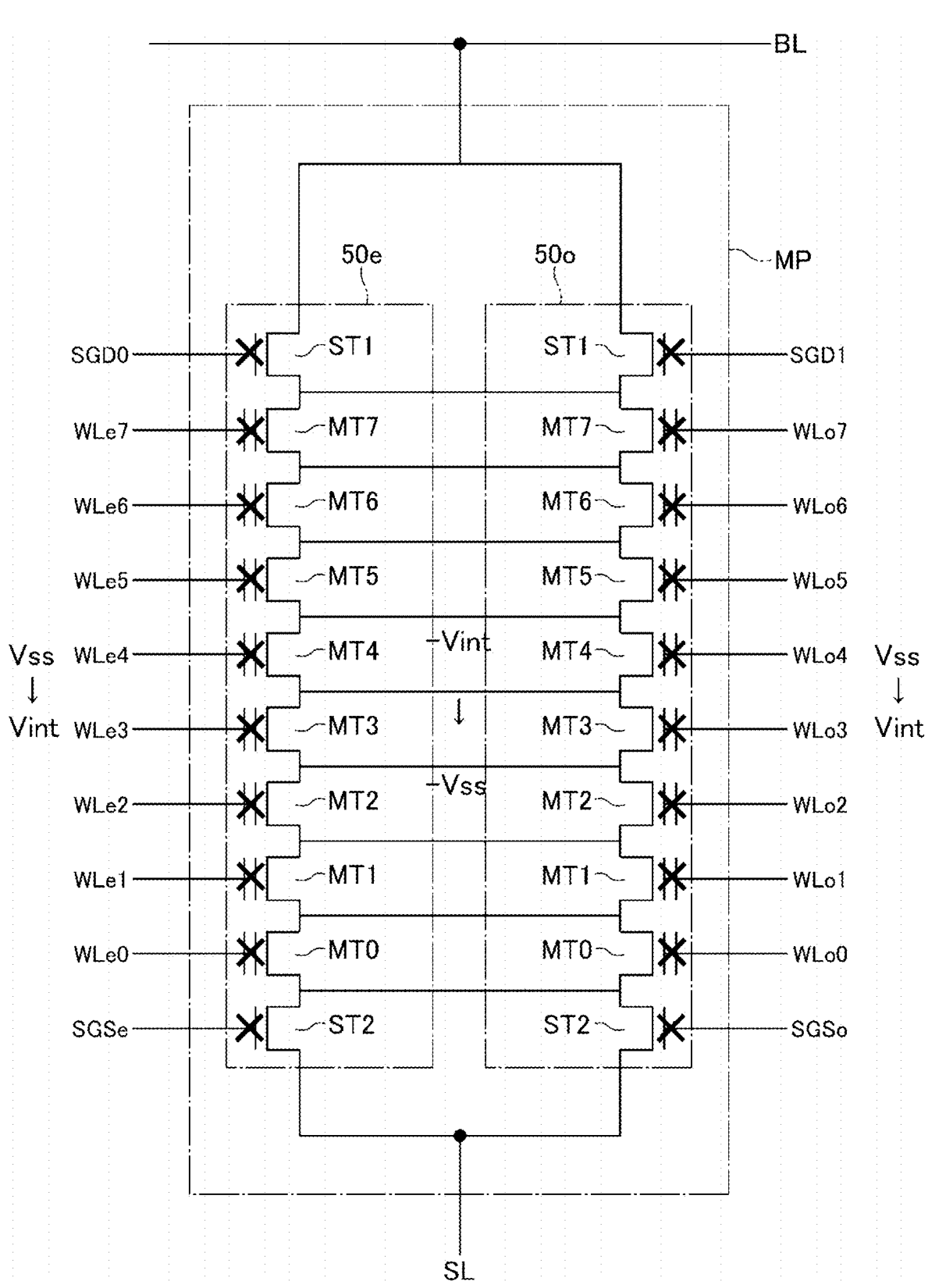
FIG. 24 is a diagram showing an example of the voltage in the semiconductor memory device of the comparative example.

The electrons in the channel, for example, gradually leak out to the bit line BL and the source line SL via the select transistor ST. As a result, as shown in FIG. 24, the voltage of the channel gradually approaches Vss (0 V) from the negative voltage.

In this state, in the seventh operation at time point 208, the signal line CGe and the word line WLe are cut off, and the signal line CGo and the word line WLo are cut off, so that the word line WLe and the word line WLo enter the floating state. Then, due to the increase in channel voltage caused by the movement of electrons from inside the channel to outside the channel, the voltage of the word line WL is gradually increased through the capacity coupling between the word line WL and the channel. For example, when the state where the voltage of the word line WL is increased as described above is maintained, as shown in FIG. 18, the threshold voltages of all the memory cell transistors MT provided in a certain block BLK may be effectively changed.

In this case, it is preferable to reduce an increase in the voltage of the word line WL after the read operation is completed in order to reduce the effective change in the threshold voltage of the memory cell transistor MT.

Figure 20:
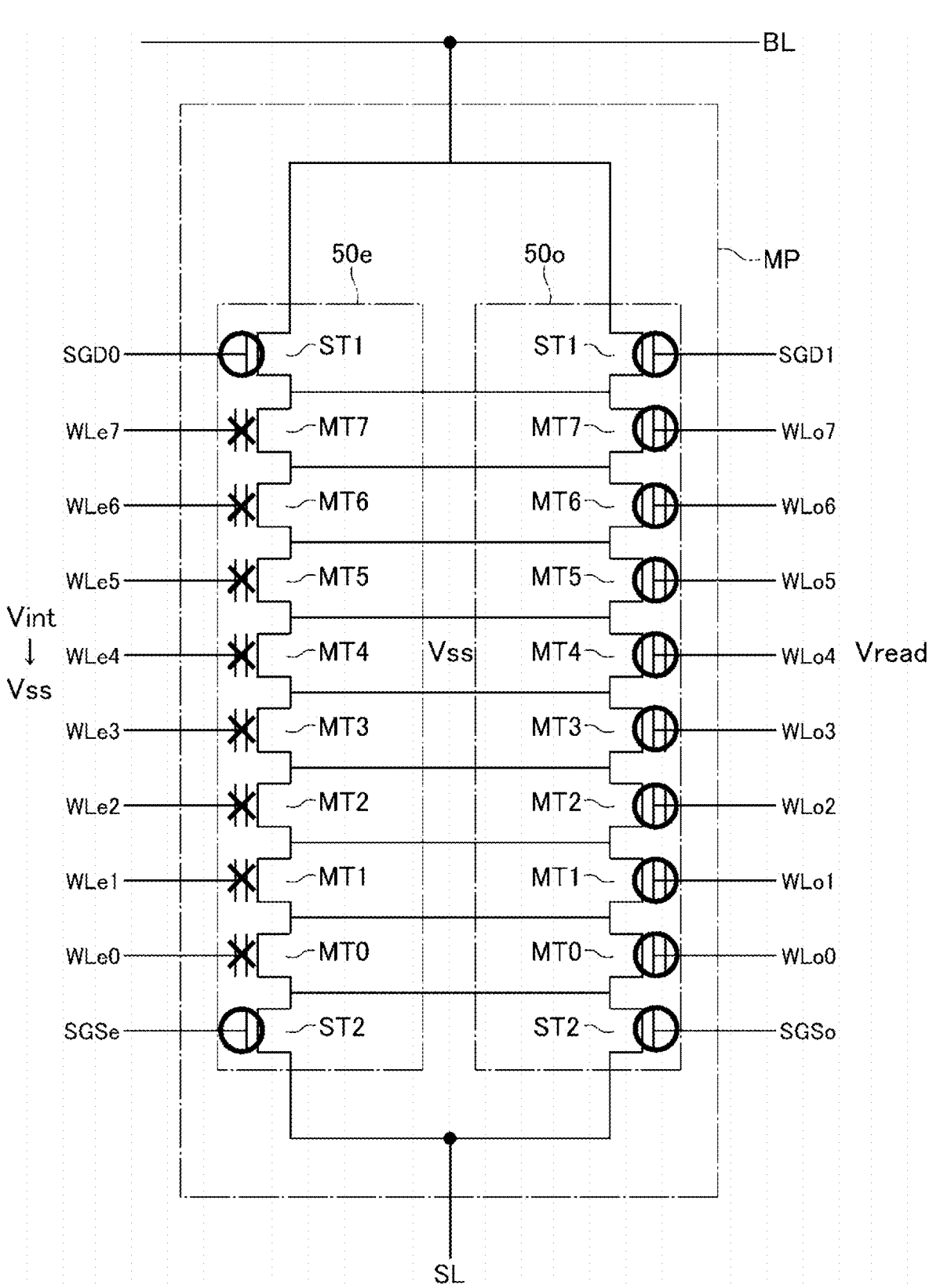
FIG. 20 is a diagram showing an example of a voltage in the semiconductor memory device according to the first embodiment.

Therefore, in the semiconductor memory device of the embodiment, as shown in FIG. 19, the fifth operation is performed at time point 105 to decrease the voltage of the word line WLe, and then the sixth operation is performed at time point 106 to decrease the voltages of the word line WLo, the select gate line SGD, and the select gate line SGS. Here, as described with reference to FIG. 11, since two NAND strings 50e and 500 are formed in one memory pillar MP, the memory cell transistors MT0 to MT7 facing each other share the channel. As a result, as shown in FIG. 20, in a period after the fifth operation is performed and before the sixth operation is performed, the memory cell transistor MT connected to the word line WLo can be kept on even when the voltage of the word line WLe is decreased. Therefore, the channel of the NAND string 50e is electrically connected to the bit line BL and/or the source line SL via the channel of the NAND string 500, and the voltage of the channel is maintained without becoming a negative voltage.

Figure 21:
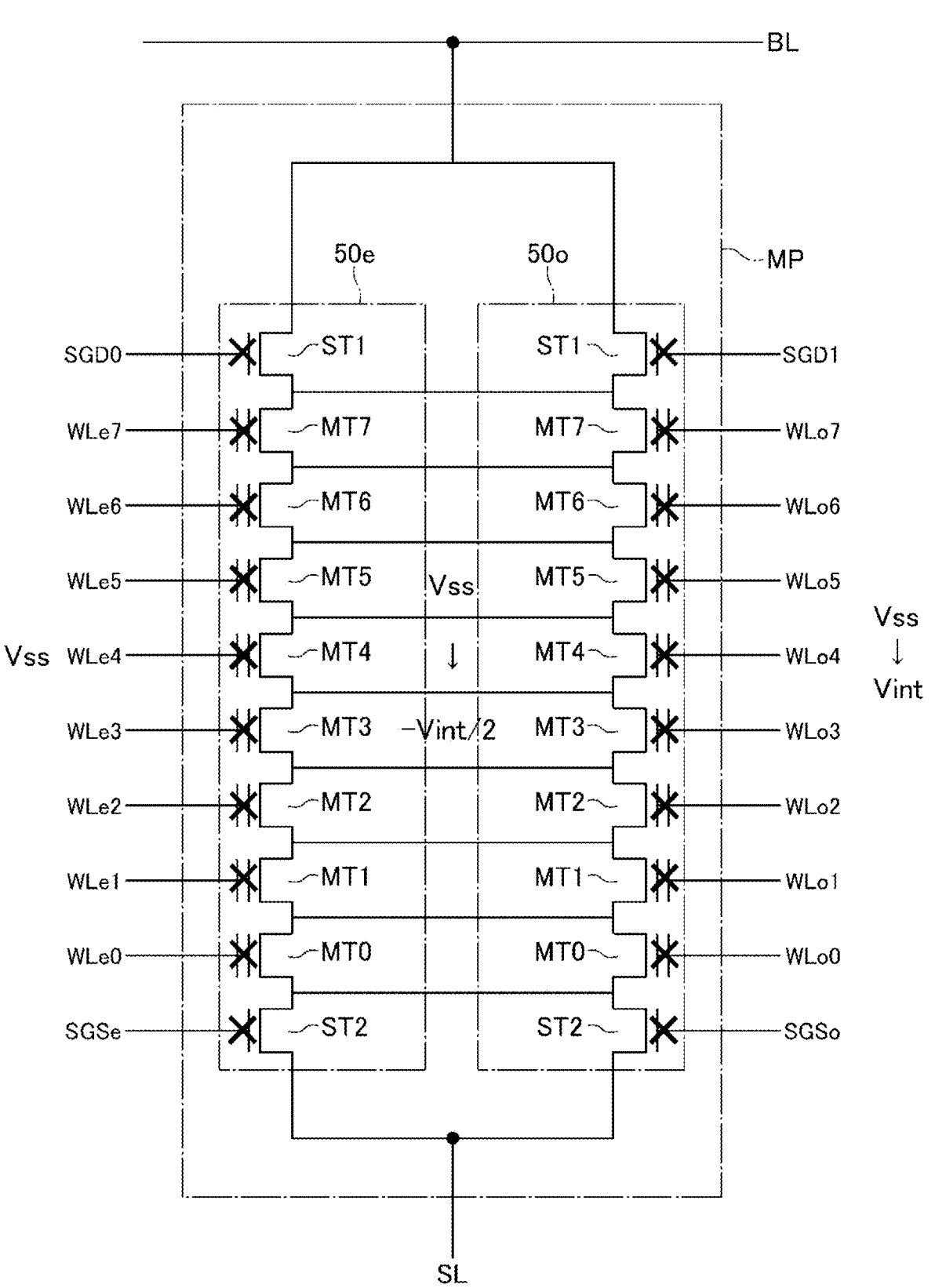
FIG. 21 is a diagram showing an example of the voltage in the semiconductor memory device according to the first embodiment.

In this state, when the sixth operation is performed at time point 106 to decrease the voltages of the word line WLo, the select gate line SGD, and the select gate line SGS, the select transistor ST is turned off, as shown in FIG. 21. As a result, the channel of the NAND string 50c and the channel of the NAND string 500 enter the floating state. In this state, when the voltage of the word line WL is further decreased, the voltage of the channel of the NAND string 50e and the voltage of the channel of the NAND string 500 become a negative voltage (voltage lower than the voltage Vss) via the capacitance coupling between the word line WL and the channel. Meanwhile, the channel of the NAND string 50e and the channel of the NAND string 500 also have the capacitance coupling with the word line WLe, which is already at the voltage Vss. Therefore, for example, when the voltage of the word line WLo at a point in time at which the select transistor ST is turned off is Vint, the voltages of the channel of the NAND string 50e and the channel of the NAND string 500 change to −Vint/2 from Vss (0 V).

Therefore, according to the first embodiment, it is possible to reduce the decrease in the channel voltage that results from the capacitance coupling between the word line WL and the channel in comparison to the comparative example. As a result, it is possible to reduce the increase in the voltage of the word line WL through the capacitance coupling between the word line WL and the channel, which occurs when the electrons in the channel move to outside of the channel. In addition, it is possible to reduce the variation in the effective threshold voltage of the memory cell transistor. That is, according to the first embodiment, it is possible to provide the semiconductor memory device in which the variation in the effective threshold voltage of the memory cell transistor is reduced in comparison to the comparative example.

Figure 25:
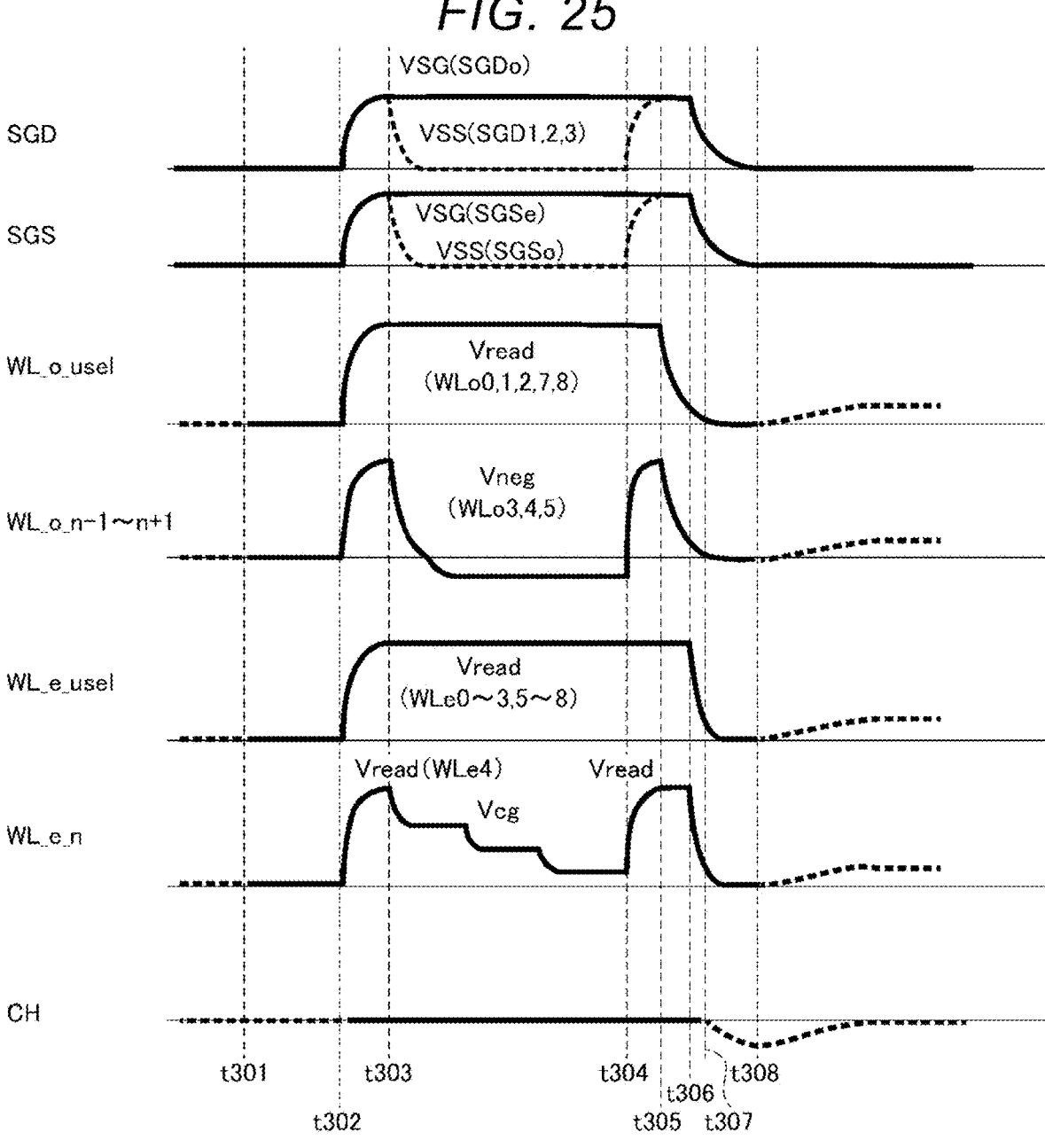
FIG. 25 is a diagram schematically showing a timing chart of various signals during the data read operation in the semiconductor memory device of the modification example of the first embodiment.

FIG. 25 is a diagram schematically showing a timing chart of various signals during the data read operation in the second example of the semiconductor memory device according to the first embodiment.

The first operation, the second operation, the third operation, and the fourth operation of the semiconductor memory device of the second example of the first embodiment are the same as the first operation, the second operation, the third operation, and the fourth operation of the semiconductor memory device of the first embodiment.

Next, the fifth operation is performed. Specifically, the voltages of the word line WLo0, the word line WLo1, the word line WLo2, the word line WLo3, the word line WLo4, the word line WLo5, the word line WLo6, and the word line WLo7 are decreased. For example, the voltages of the word line WLo0, the word line WLo1, the word line WLo2, the word line WLo3, the word line WLo4, the word line WLo5, the word line WLo6, and the word line WLo7 are decreased to Vss.

Next, the sixth operation is performed. Specifically, the voltages of the word line WLe0, the word line WLe1, the word line WLe2, the word line WLe3, the word line WLe4, the word line WLe5, the word line WLe6, and the word line WLe7 are decreased. For example, the voltages of the word line WLe0, the word line WLe1, the word line WLe2, the word line WLe3, the word line WLe4, the word line WLe5, the word line WLe6, and the word line WLe7 are decreased to Vss. In addition, Vss is applied to the select gate line SGSe, the select gate line SGSo, the select gate line SGD0, and the select gate line SGD1.

The seventh operation is the same as the seventh operation of the semiconductor memory device according to the present embodiment.

In the semiconductor memory device of the second example of the first embodiment, after the voltages of the word line WLo0, the word line WLo1, the word line WLo2, the word line WLo3, the word line WLo4, the word line WLo5, the word line WLo6, and word line WLo7 are decreased, the voltages of the word line WLe0, the word line WLe1, the word line WLe2, the word line WLe3, the word line WLe4, the word line WLe5, the word line WLe6, and the word line WLe7 are decreased. As a result, the memory cell transistor MT connected to the word line WLe can be kept on even when the voltage of the word line WLo is decreased. As a result, it is possible to reduce the increase in the voltage of the word line WL that results from the capacitance coupling between the word line WL and the channel, which occurs when the electrons in the channel move to outside of the channel.

According to the semiconductor memory device of the first embodiment, it is possible to provide the semiconductor memory device capable of reducing the variation in threshold voltage of the memory cell transistor.

Second Embodiment

Figure 26:
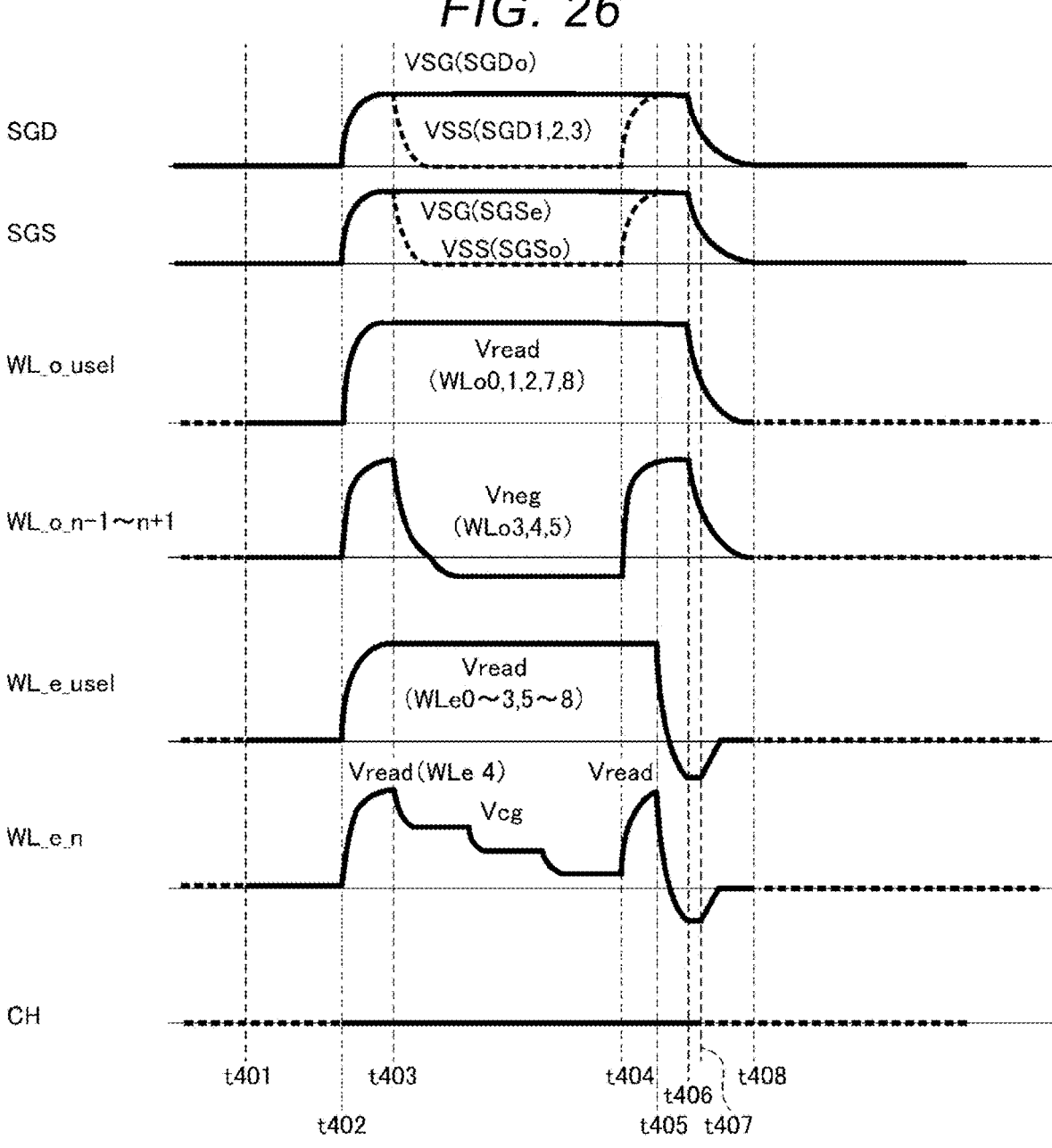
FIG. 26 is a diagram schematically showing a timing chart of various signals during the data read operation in the semiconductor memory device according to a second embodiment.

FIG. 26 is a diagram schematically showing a timing chart of various signals during the data read operation in the semiconductor memory device according to a second embodiment.

In the semiconductor memory device of the second embodiment, after the sixth operation of the semiconductor memory device of the first embodiment, the voltages of the WLe0, the word line WLe1, the word line WLe2, the word line WLe3, the word line WLe4, the word line WLe5, the word line WLe6, and the word line WLe7 are increased.

In the fifth operation, the voltages of the word line WLe0, the word line WLe1, the word line WLe2, the word line WLe3, the word line WLe4, the word line WLe5, the word line WLe6, and the word line WLe7 are decreased to Vneg. Next, in the sixth operation, the voltages of the word line WLo0, the word line WLo1, the word line WLo2, the word line WLo3, the word line WLo4, the word line WLo5, the word line WLo6, and the word line WLo7 are decreased to Vss. In addition, Vss is applied to the select gate line SGSe, the select gate line SGSo, the select gate line SGD0, and the select gate line SGD1. Next, the voltages of the word line WLe0, the word line WLe1, the word line WLe2, the word line WLe3, the word line WLe4, the word line WLe5, the word line WLe6, and the word line WLe7 are increased, for example, to Vss. Next, the seventh operation of the semiconductor memory device according to the first embodiment is performed.

In the semiconductor memory device of the second embodiment, the voltages of the word line WLe0, the word line WLe1, the word line WLe2, the word line WLe3, the word line WLe4, the word line WLe5, the word line WLe6, and the word line WLe7 are decreased to Vneg further lower than Vss. In this case as well, the voltage of the channel is maintained. Next, the voltages of the word line WLo0, the word line WLo1, the word line WLo2, the word line WLo3, the word line WLo4, the word line WLo5, the word line WLo6, and the word line WLo7 are decreased to Vss. Here, for example, Vss is applied to the select gate line SGSe, the select gate line SGSo, the select gate line SGD0, and the select gate line SGD1, and, at a timing at which the channels are likely to enter the floating state, the voltages of the word line WLe0, the word line WLe1, the word line WLe2, the word line WLe3, the word line WLe4, the word line WLe5, the word line WLe6, and the word line WLe7 are increased to Vss. Then, the decrease in the channel voltage due to the decrease in the voltage of the word line WLo is canceled by the increase in the channel voltage due to the increase in the voltage of the word line WLe. As a result, it is possible to provide the semiconductor memory device capable of reducing the variation in the threshold voltage of the memory cell transistor.

In the semiconductor memory device of the second example of the second embodiment, after the sixth operation of the semiconductor memory device of the second example of the first embodiment, the voltages of the WLe0, the word line WLe1, the word line WLe2, the word line WLe3, the word line WLe4, the word line WLe5, the word line WLe6, and the word line WLe7 may be increased.

For example, in the fifth operation of the semiconductor memory device of the second example of the first embodiment, the voltages of the word line WLo0, the word line WLo1, the word line WLo2, the word line WLo3, the word line WLo4, the word line WLo5, the word line WLo6, and the word line WLo7 are decreased to, for example, Vneg. Next, in the sixth operation, the voltages of the word line WLe0, the word line WLe1, the word line WLe2, the word line WLe3, the word line WLe4, the word line WLe5, the word line WLe6, and the word line WLe7 are decreased to, for example, Vss. In addition, Vss is applied to the select gate line SGSe, the select gate line SGSo, the select gate line SGD0, and the select gate line SGD1. Next, the voltages of the word line WLo0, the word line WLo1, the word line WLo2, the word line WLo3, the word line WLo4, the word line WLo5, the word line WLo6, and the word line WLo7 are increased to, for example, Vss. Next, the seventh operation of the semiconductor memory device according to the first embodiment is performed. As a result, it is possible to provide the semiconductor memory device capable of reducing the variation in the threshold voltage of the memory cell transistor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a substrate;
   a first conductive layer that is provided above the substrate, is spaced apart from the substrate in a first direction, and is parallel to a substrate surface of the substrate;
   a second conductive layer that is provided above the substrate, is adjacent to the first conductive layer in a second direction intersecting the first direction, and is parallel to the substrate surface;
   a third conductive layer that is provided between the substrate and the first conductive layer, and is parallel to the substrate surface;
   a fourth conductive layer that is provided between the substrate and the second conductive layer, is adjacent to the third conductive layer in the second direction, and is parallel to the substrate surface;
   a fifth conductive layer that is provided above the first conductive layer, and is parallel to the substrate surface;

a sixth conductive layer that is provided above the second conductive layer, is adjacent to the fifth conductive layer in the second direction, and is parallel to the substrate surface;

a seventh conductive layer that is provided between the substrate and the third conductive layer, and is parallel to the substrate surface;

an eighth conductive layer that is provided between the substrate and the fourth conductive layer, is adjacent to the seventh conductive layer in the second direction, and is parallel to the substrate surface;

a ninth conductive layer that is provided above the fifth conductive layer, and is parallel to the substrate surface;

a tenth conductive layer that is provided above the sixth conductive layer, is adjacent to the ninth conductive layer in the second direction, and is parallel to the substrate surface;

a memory pillar extending in the first direction between the first and second conductive layers, between the third and fourth conductive layers, between the fifth and sixth conductive layers, between the seventh and eighth conductive layers, and between the ninth and tenth conductive layers;

a first memory cell that is formed between the first conductive layer and the memory pillar;

a second memory cell that is formed between the second conductive layer and the memory pillar;

a third memory cell that is formed between the third conductive layer and the memory pillar;

a fourth memory cell that is formed between the fourth conductive layer and the memory pillar;

a fifth memory cell that is formed between the fifth conductive layer and the memory pillar;

a sixth memory cell that is formed between the sixth conductive layer and the memory pillar;

a seventh memory cell that is formed between the seventh conductive layer and the memory pillar;

an eighth memory cell that is formed between the eighth conductive layer and the memory pillar;

a ninth memory cell that is formed between the ninth conductive layer and the memory pillar;

a tenth memory cell that is formed between the tenth conductive layer and the memory pillar; and a control circuit that is configured to, during a read operation performed on the first memory cell:

apply a first voltage to the first conductive layer, apply a second voltage lower than the first voltage to the second conductive layer, the fourth conductive layer, and the sixth conductive layer, and apply a third voltage higher than the first voltage to the third conductive layer, the fifth conductive layer, the seventh conductive layer, the eighth conductive layer, the ninth conductive layer, and the tenth conductive layer, then, apply the third voltage to the first conductive layer, the second conductive layer, the fourth conductive layer, and the sixth conductive layer, then, apply a fourth voltage lower than the first voltage to the first conductive layer, the third conductive layer, the fifth conductive layer, the seventh conductive layer, and the ninth conductive layer, and then, apply a fifth voltage lower than the first voltage to the second conductive layer, the fourth conductive layer, the sixth conductive layer, the eighth conductive layer, and the tenth conductive layer.

2. The semiconductor memory device according to claim 1, wherein the fourth voltage and the fifth voltage are higher than the second voltage, and the fourth voltage and the fifth voltage are equal to each other.

3. The semiconductor memory device according to claim 1, wherein the control circuit is further configured to, during the read operation performed on the first memory cell:

apply a sixth voltage lower than the first voltage and higher than the fourth voltage to the first conductive layer, the third conductive layer, the fifth conductive layer, the seventh conductive layer, and the ninth conductive layer after applying the fifth voltage lower than the first voltage to the second conductive layer, the fourth conductive layer, the sixth conductive layer, the eighth conductive layer, and the tenth conductive layer.

4. The semiconductor memory device according to claim 3, wherein the second voltage and the fourth voltage are equal to each other, and the fifth voltage and the sixth voltage are equal to each other.

5. The semiconductor memory device according to claim 1, wherein the memory pillar includes a core insulating layer, a semiconductor layer surrounding the core insulating layer, a gate insulating layer surrounding the semiconductor layer, and a charge storage layer surrounding the gate insulating layer.

6. The semiconductor memory device according to claim 5, wherein the charge storage layer is made of silicon nitride.

7. The semiconductor memory device according to claim 1, wherein the memory pillar includes a core insulating layer, a semiconductor layer surrounding the core insulating layer, first and second gate insulating layers on either side of and in contact with the semiconductor layer in the second direction, a first conductive charge storage layer in contact with the first gate insulating layer, and a second conductive charge storage layer in contact with the second gate insulating layer.

8. A semiconductor memory device comprising:

a substrate;

a first conductive layer that is provided above the substrate, is spaced apart from the substrate in a first direction, and is parallel to a substrate surface of the substrate;

a second conductive layer that is provided above the substrate, is adjacent to the first conductive layer in a second direction intersecting the first direction, and is parallel to the substrate surface;

a third conductive layer that is provided between the substrate and the first conductive layer, and is parallel to the substrate surface;

a fourth conductive layer that is provided between the substrate and the second conductive layer, is adjacent to the third conductive layer in the second direction, and is parallel to the substrate surface;

a fifth conductive layer that is provided above the first conductive layer, and is parallel to the substrate surface;

a sixth conductive layer that is provided above the second conductive layer, is adjacent to the fifth conductive layer in the second direction, and is parallel to the substrate surface;

a seventh conductive layer that is provided between the substrate and the third conductive layer, and is parallel to the substrate surface;

an eighth conductive layer that is provided between the substrate and the fourth conductive layer, is adjacent to the seventh conductive layer in the second direction, and is parallel to the substrate surface;

a ninth conductive layer that is provided above the fifth conductive layer, and is parallel to the substrate surface;

a tenth conductive layer that is provided above the sixth conductive layer, is adjacent to the ninth conductive layer in the second direction, and is parallel to the substrate surface;

a memory pillar extending in the first direction between the first and second conductive layers, between the third and fourth conductive layers, between the fifth and sixth conductive layers, between the seventh and eighth conductive layers, and between the ninth and tenth conductive layers;

a first memory cell that is formed between the first conductive layer and the memory pillar;

a second memory cell that is formed between the second conductive layer and the memory pillar;

a third memory cell that is formed between the third conductive layer and the memory pillar;

a fourth memory cell that is formed between the fourth conductive layer and the memory pillar;

a fifth memory cell that is formed between the fifth conductive layer and the memory pillar;

a sixth memory cell that is formed between the sixth conductive layer and the memory pillar;

a seventh memory cell that is formed between the seventh conductive layer and the memory pillar;

an eighth memory cell that is formed between the eighth conductive layer and the memory pillar;

a ninth memory cell that is formed between the ninth conductive layer and the memory pillar;

a tenth memory cell that is formed between the tenth conductive layer and the memory pillar; and a control circuit that is configured to, during a read operation performed on the first memory cell:

apply a first voltage to the first conductive layer, apply a second voltage lower than the first voltage to the second conductive layer, the fourth conductive layer, and the sixth conductive layer, and apply a third voltage higher than the first voltage to the third conductive layer, the fifth conductive layer, the seventh conductive layer, the eighth conductive layer, the ninth conductive layer, and the tenth conductive layer, then, apply the third voltage to the first conductive layer, the second conductive layer, the fourth conductive layer, and the sixth conductive layer, then, apply a fourth voltage lower than the first voltage to the second conductive layer, the fourth conductive layer, the sixth conductive layer, the eighth conductive layer, and the tenth conductive layer, and then, apply a fifth voltage lower than the first voltage to the first conductive layer, the third conductive layer, the fifth conductive layer, the seventh conductive layer, and the ninth conductive layer.

9. The semiconductor memory device according to claim 8, wherein the fourth voltage and the fifth voltage are higher than the second voltage, and the fourth voltage and the fifth voltage are equal to each other.

10. The semiconductor memory device according to claim 8, wherein the control circuit is further configured to, during the read operation performed on the first memory cell:

apply a sixth voltage lower than the first voltage and higher than the fourth voltage to the second conductive layer, the fourth conductive layer, the sixth conductive layer, the eighth conductive layer, and the tenth conductive layer after applying the fifth voltage to the first conductive layer, the third conductive layer, the fifth conductive layer, the seventh conductive layer, and the ninth conductive layer.

11. The semiconductor memory device according to claim 10, wherein the second voltage and the fourth voltage are equal to each other, and the fifth voltage and the sixth voltage are equal to each other.

12. The semiconductor memory device according to claim 8, wherein the memory pillar includes a core insulating layer, a semiconductor layer surrounding the core insulating layer, a gate insulating layer surrounding the semiconductor layer, and a charge storage layer surrounding the gate insulating layer.

13. The semiconductor memory device according to claim 12, wherein the charge storage layer is made of silicon nitride.

14. The semiconductor memory device according to claim 8, wherein the memory pillar includes a core insulating layer, a semiconductor layer surrounding the core insulating layer, first and second gate insulating layers on either side of and in contact with the semiconductor layer in the second direction, a first conductive charge storage layer in contact with the first gate insulating layer, and a second conductive charge storage layer in contact with the second gate insulating layer.

15. A method of performing a read operation on a semiconductor memory device comprising:

a substrate;

a memory pillar extending in a first direction;

first and second conductive layers on either side of the memory pillar in a second direction intersecting the first direction;

third and fourth conductive layers below the first and second conductive layers, respectively, on either side of the memory pillar in the second direction;

fifth and sixth conductive layers above the first and second conductive layers, respectively, on either side of the memory pillar in the second direction;

seventh and eighth conductive layers below the third and fourth conductive layers, respectively, on either side of the memory pillar in the second direction;

ninth and tenth conductive layers above the fifth and sixth conductive layers, respectively, on either side of the memory pillar in the second direction; and first through tenth memory cells that are formed between a respective one of the first through tenth conductive layers and the memory pillar, said method comprising:

applying a first voltage to the first conductive layer, applying a second voltage lower than the first voltage to the second conductive layer, the fourth conductive layer, and the sixth conductive layer, and applying a third voltage higher than the first voltage to the third conductive layer, the fifth conductive layer, the seventh conductive layer, the eighth conductive layer, the ninth conductive layer, and the tenth conductive layer, then, applying the third voltage to the first conductive layer, the second conductive layer, the fourth conductive layer, and the sixth conductive layer, then, applying a fourth voltage lower than the first voltage to a first group of the conductive layers, and then, applying a fifth voltage lower than the first voltage to a second group of the conductive layers.

16. The method according to claim 15, wherein the first group of the conductive layers includes the first, third, fifth, seventh, and ninth conductive layers, and the second group of the conductive layers includes the second, fourth, sixth, eighth, and tenth conductive layers.

17. The method according to claim 15, wherein the first group of the conductive layers includes the second, fourth, sixth, eighth, and tenth conductive layers, and the second group of the conductive layers includes the first, third, fifth, seventh, and ninth conductive layers.

18. The method according to claim 15, wherein the fourth voltage and the fifth voltage are higher than the second voltage, and the fourth voltage and the fifth voltage are equal to each other.

19. The method according to claim 15, further comprising:

applying a sixth voltage lower than the first voltage and higher than the fourth voltage to the first group of the conductive layers after applying the fifth voltage to the second group of the conductive layers.

20. The method according to claim 19, wherein the second voltage and the fourth voltage are equal to each other, and the fifth voltage and the sixth voltage are equal to each other.

* * * * *